(12) United States Patent
Watanabe et al.

(10) Patent No.: US 6,407,453 B1
(45) Date of Patent: Jun. 18, 2002

(54) SEMICONDUCTOR DEVICE AND METHOD OF MANUFACTURING THE SAME

(75) Inventors: Tadayoshi Watanabe; Sachiyo Ito, both of Yokohama; Takamasa Usui, Kawasaki; Hisashi Kaneko, Fujisawa; Masako Morita, Yokohama; Hirokazu Ezawa, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,418

(22) Filed: Mar. 9, 2000

(30) Foreign Application Priority Data

Mar. 11, 1999 (JP) .............................. 11-064595

(51) Int. Cl.[7] .............................................. H01L 23/48
(52) U.S. Cl. ...................................................... 257/758
(58) Field of Search ................................ 257/758, 659, 257/741, 748, 761, 751, 757, 771–773; 438/635, 660, 637

(56) References Cited

U.S. PATENT DOCUMENTS 5,952,723 A * 9/1999 Takeyasu et al. ............ 257/771

FOREIGN PATENT DOCUMENTS

JP 10-150040 6/1998

OTHER PUBLICATIONS

J.L. Hurd et al., "Linewidth and Underlayer Influence on Texture in Submicrometer–Wide Al and AlCu Lines", Appl. Phys. Lett., vol. 72, No. 3, (1998).

J.M.E. Harper et al., "Microstructure Control in Semiconductor Metallization", J. Vac. Sci. Technol. B, vol. 15, No. 4, (1997).

* cited by examiner

Primary Examiner—Howard Weiss
Assistant Examiner—(Vikki) Hoa B. Trinh
(74) Attorney, Agent, or Firm—Finnegan, Henderson, Farabow, Garrett & Dunner, L.L.P.

(57) ABSTRACT

Disclosed is a semiconductor device, comprising a semiconductor substrate, an insulating layer and a metallic wiring layer formed on the semiconductor substrate; and an intermediate layer formed between the insulating layer and the metallic wiring layer in contact with both the insulating layer and the metallic wiring layer, wherein the intermediate layer contains the metallic material forming the metallic wiring layer, Si and O.

14 Claims, 26 Drawing Sheets

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 11-064595, filed Mar. 11, 1999, the entire contents of which are incorporated herein by reference.

BACKGROUND OF THE INVENTION

The present invention relates to a semiconductor device, particularly, to an LSI with an improved wiring reliability.

The conventional RIE (reactive ion etching) wiring has characteristics as shown in FIG. 1. Specifically, a nonuniformity of defectiveness ($\sigma$ value of EM log-normal distribution) is large in a region of a certain wiring width. The reason for the presence of the particular region is that there is a region in which a bamboo ratio of a grain size to a width of the wiring is diminished. Specifically, the $\sigma$ value is large in a region where the bamboo ratio is about 10 to 50%. In a wiring EM (electro migration) endurance, an essential problem is derived from the presence of the particular region.

The conventional wiring structure includes a RIE wiring and a damascene wiring. In each of these wiring structures, all surfaces of the wiring layer made of Al, Cu, etc. are brought into contact with the insulating layer directly or with a liner interposed therebetween. Since such a surface has a high interfacial energy, the interfacial diffusion causes EM to proceed. As a result, the activation energy of EM is low, e.g., 0.2 to 0.6 eV. Also, during the EM testing, the metal atoms forming the wiring are migrated from the cathode (−) toward the anode (+). As a result of decreasing the density of the metal atoms on the side of the cathode, a tensile stress is generated on the side of the cathode.

If the tensile stress exceeds a critical stress, voids are generated in the wiring. If the insulating layer positioned to surround the wiring is capable of receiving the stress from the wiring and, thus, capable of being deformed elastically in accordance with the deformation of the wiring, EM-induced tensile stress is inhibited. However, it was customary in the past to use, for example, a plasma $SiO_2$ film or a plasma SiN film as an interlayer, intra layer insulating film or a passivation film. What should be noted is that these plasma $SiO_2$ film and plasma SiN film have large values of Young's modulus exceeding 50 GPa. As a result, these films are scarcely deformed elastically upon receipt of the stress. It follows that the effect of inhibiting the tensile stress acting on the side of the cathode, said effect being produced by these films, is very small. Such being the situation, the conventional multi-layer wiring structure is low in EM reliability.

BRIEF SUMMARY OF THE INVENTION

An object of the present invention is to provide a semiconductor device having a high EM reliability.

Another object is to provide a method of manufacturing a semiconductor device having a high EM reliability.

According to a first aspect of the present invention, there is provided a semiconductor device, comprising:

a semiconductor substrate;

an insulating layer formed on the semiconductor substrate and having a groove portion for wiring; and a wiring formed in the groove portion for wiring of the insulating layer,
  wherein an inclined grain boundary is present in an optional cross section parallel to a longitudinal direction of the wiring; and
  an inclination not more than 60° is formed between the inclined grain boundary and a surface of the semiconductor substrate.

According to a second aspect of the present invention, there is provided a method of manufacturing a semiconductor device, wherein the semiconductor device comprises:

a semiconductor substrate;

an insulating layer formed on the semiconductor substrate and having a groove portion for wiring; and a wiring formed in the groove portion for wiring of the insulating layer,
  wherein an inclined grain boundary is present in an optional cross section parallel to a longitudinal direction of the wiring; and
  an inclination not more than 60° is formed between the inclined grain boundary and a surface of the semiconductor substrate, the method comprising the steps of:
  depositing a wiring material;
  etching the deposited wiring material to form a groove; and
  burying a wiring material in the groove.

According to a third aspect of the present invention, there is provided a semiconductor device, comprising:

a semiconductor substrate;

an insulating layer and a metallic wiring layer formed on the semiconductor substrate; and an intermediate layer formed between the insulating layer and the metallic wiring layer in contact with both the insulating layer and the metallic wiring layer,
  wherein the intermediate layer contains a metallic material constituting the metallic wiring layer, Si and O.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some Examples of the present invention will now be described with reference to the accompanying drawings.

EXAMPLE I

Example I-1

FIGS. 2A to 2D and FIGS. 3A to 3D collectively show a method of manufacturing a semiconductor device according to one embodiment of the present invention.

Figure 1:
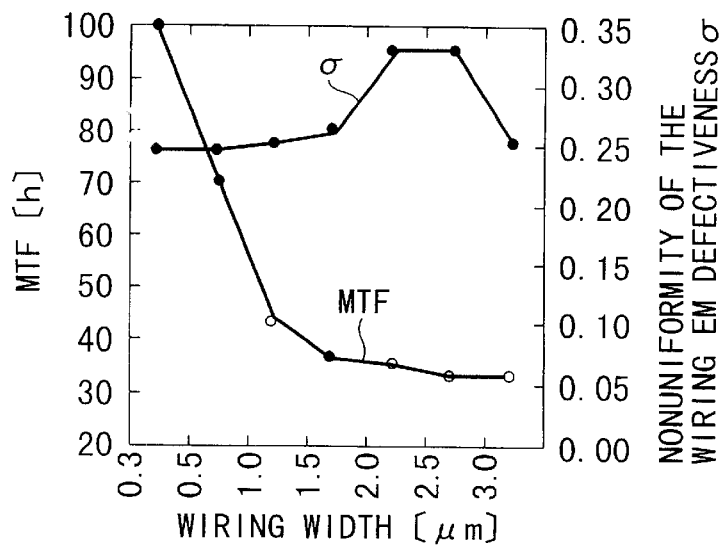
FIG. 1 is a graph showing the relationship between MTF (median time to failure) and the wiring width and the relationship between the wiring width and the nonuniformity $\sigma$ of the wiring EM failure in a conventional RIE wiring.
Figure 2A:
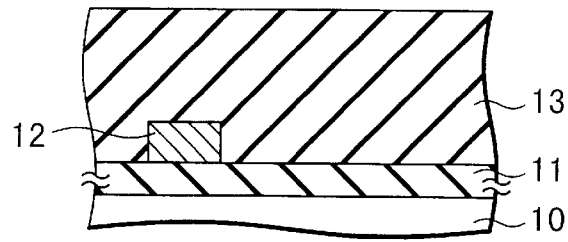
FIGS. 2A to 2D are cross sectional views collectively illustrating one example of a method of the present invention for manufacturing a semiconductor device of the present invention.
Figure 2B:
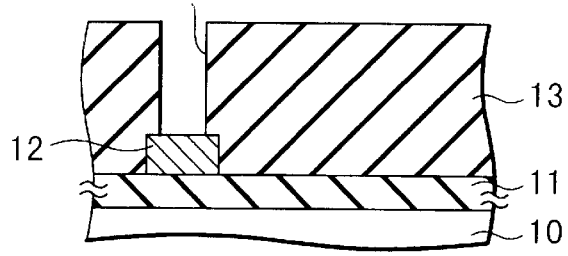
Figure 2C:
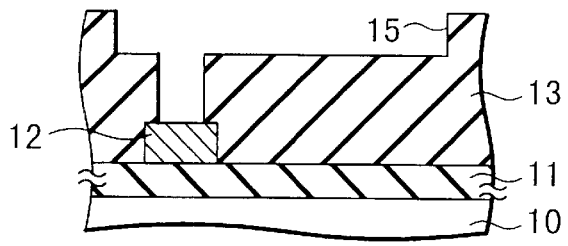

In the first step, an insulating layer 11 and a W, Al or Al alloy, Cu wiring 12 were successively formed on a silicon substrate 10, followed by depositing an interlayer insulating film 13 on the insulating layer 11 and the wiring 12, as shown in FIG. 2A. Then, a via hole 14 was formed in the interlayer insulating film 13 as shown in FIG. 2B, followed by forming a groove 15 for forming an upper layer wiring in the interlayer insulating film 13, as shown in FIG. 2C.

Figure 2D:
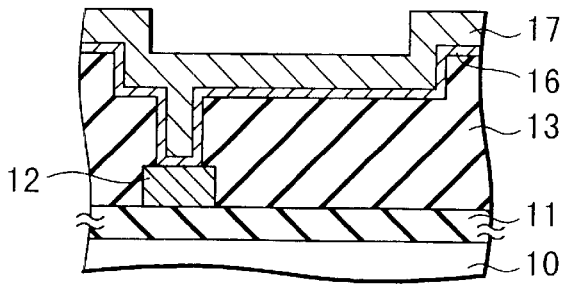

Then, a liner 16 was formed by depositing Nb by a sputtering method on the bottoms and side walls of the via hole 14 and the groove 15, as shown in FIG. 2D. Niobium (Nb) is a refractory metal differing from the material used for forming the wiring. After formation of the liner 16, an Al layer 17 was formed by a sputtering method on the liner 16. An LTS (long throw sputtering method), in which the distance between a sputtering target and a silicon substrate is sufficiently long, was employed for forming the Al layer 17.

Figure 3A:
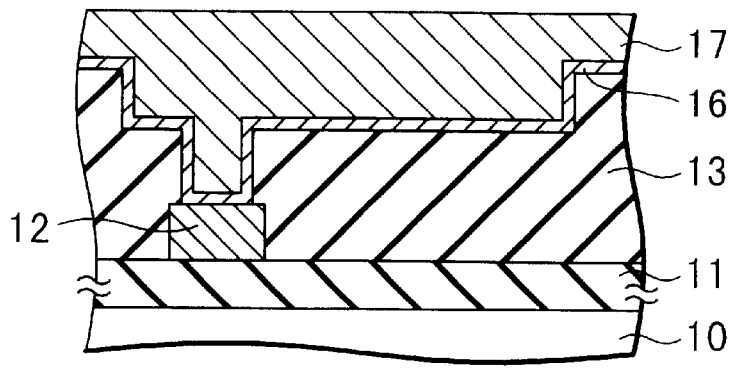
FIGS. 3A to 3C are cross sectional views collectively illustrating another example of a method of the present invention for manufacturing a semiconductor device of the present invention.

Further, the groove 15 was filled with the Al layer 17 as follows. Specifically, a nitrogen gas was introduced into a sputtering chamber to increase the inner pressure of the sputtering chamber from $3 \times 10^{-6}$ Pa to $5 \times 10^{-4}$ Pa, followed by applying a reflow sputtering while heating the silicon substrate, thereby to finish deposition of Al metal, as shown in FIG. 3A.

Figure 3B:
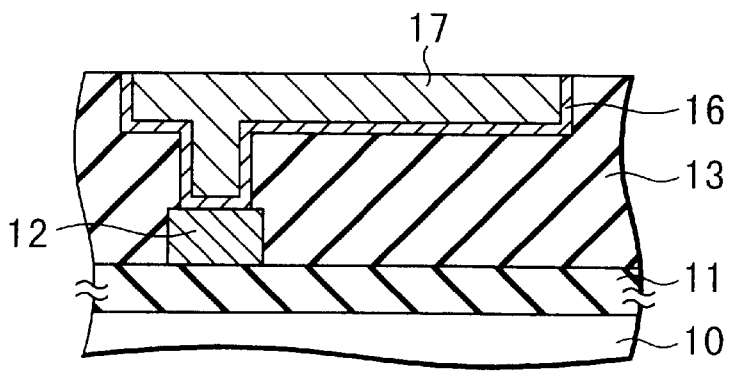
Figure 3C:
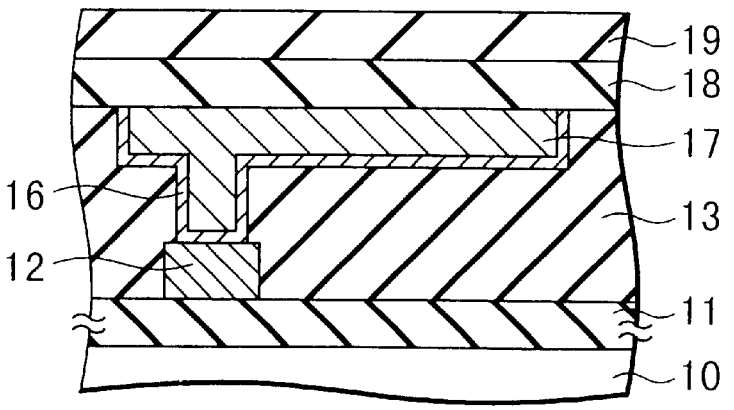

After formation of the Al layer 17, the excess Al layer positioned above the interlayer insulating film 13 was removed by a CMP (chemical mechanical polishing) so as to form a wiring and a via, as shown in FIG. 3B. Further, a $SiO_2$ film 18 and a SiN film 19 were successively deposited on the entire surface to form a passivation layer, as shown in FIG. 3C, thereby to obtain a sample of this Example.

Figure 4:
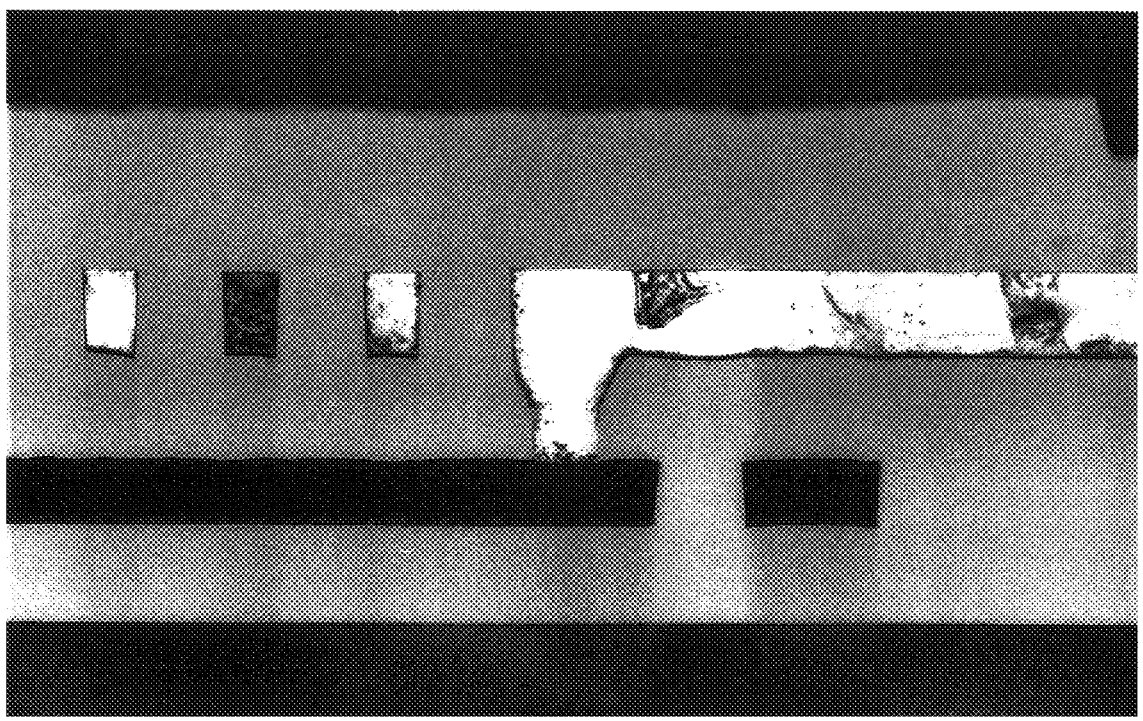
FIG. 4 is a TEM photo showing a cross section parallel to a longitudinal direction of a wiring in a semiconductor device of the present invention.

A cross section in a longitudinal direction of the wiring was observed by TEM in an optional position of the wiring in respect of the sample prepared by the process described above. FIG. 4 shows the TEM photo. As shown in the photo, a grain boundary (bamboo-like grain boundary) extending in a direction perpendicular to the longitudinal direction of the wiring is present in the wiring. Further, a grain boundary that is not perpendicular to the longitudinal direction of the wiring is also present in the wiring. Particularly, a grain boundary extending in a direction parallel to the longitudinal direction of the wiring, i.e., H-type grain boundary, is present in the vicinity of the via of the wiring.

In this Example, the Al wiring was formed as follows. In the first step, an Al layer was deposited by an LTS method, followed by adding a nitrogen gas and subsequently filling the groove 15 with Al by a reflow sputtering method. Since the Al wiring was formed by this method, it was possible to form in the wiring the grain boundary that was not perpendicular to the longitudinal direction of the wiring.

The angle of inclination of the grain boundary, which was not perpendicular to the longitudinal direction of the wiring, relative to the silicon substrate surface was found to be not larger than 60°. Also, it was confirmed by the TEM photo that a reaction product between Nb and Al had been formed at the bottom portion and side walls of the wiring. The liner and the reaction product layer play the role of prolonging the life of the wiring.

Figure 5:
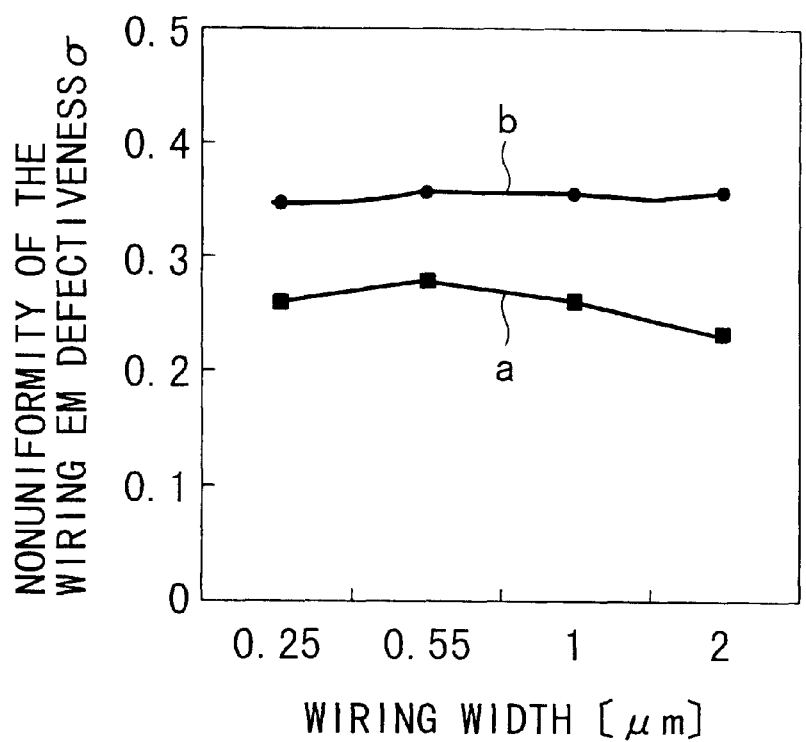
FIG. 5 is a graph showing the relationship between the wiring width and the nonuniformity σ of the wiring EM failure in a semiconductor device of the present invention.

After the electrical characteristics of the samples were measured, an EM testing was applied to each of the samples having various wiring widths, with the results as shown in the graph of FIG. 5. Curve a in the graph covers the semiconductor device of the present invention, with curve b covering the semiconductor device having a conventional buried type wiring. In the semiconductor device having a conventional buried type wiring (curve b), the σ value, i.e., nonuniformity of defective wiring, was found to be about 0.35. On the other hand, the σ value for the semiconductor device of the present invention (curve a) was found to be less than 0.30 regardless of the wiring width. The experimental data clearly support that the present invention permits improving the reliability of the wiring. The satisfactory σ value, which was less than approximately 0.30, was derived from the presence of the H-type grain boundary in the vicinity of the via as shown in the TEM photo of FIG. 4. If the H-type grain boundary is present in the vicinity of the via, the critical value of the tensile stress for forming voids is locally lowered, with the result that the void formation is triggered by the H-type grain boundary. In this fashion, a single defective mode was achieved in the vicinity of the via in this Example. In other words, it is necessary for the H-type grain boundary to be present in the vicinity of the via. To be more specific, it is desirable for at least one H-type grain boundary to be present in the upper portion of the via within the wiring or in a region within 3 μm or less from the via.

Figure 6:
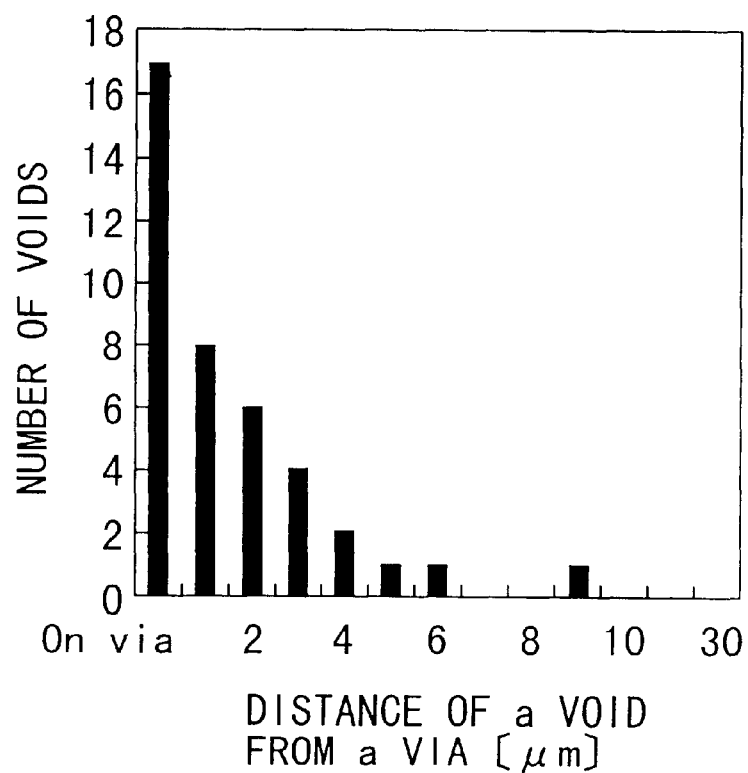
FIG. 6 is a graph showing the relationship between the distance of an EM induced void from a via and the number of voids in a wiring of the present invention.

FIG. 6 is a graph showing the relationship between the distance from the via and the number of voids in respect of the semiconductor device obtained in the Example. There are about 30 samples for EM testing in FIG. 6, each sample has a one EM induced stress void.

Figure 7:
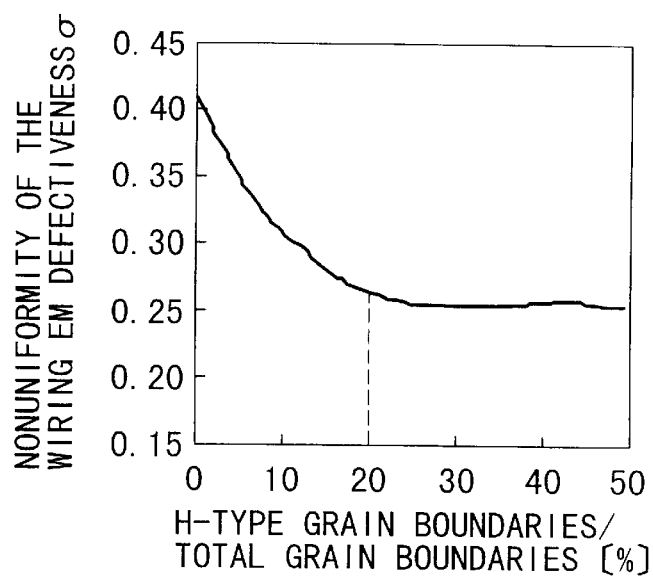
FIG. 7 is a graph showing the relationship between the ratio of presence of H-type grain boundary and the nonuniformity σ of the wiring EM failure in a semiconductor device of the present invention.

FIG. 7 shows the relationship between the percentage of the H-type grain boundaries based on the total grain boundaries and the nonuniformity σ of the wiring EM failure. In this experiment, the wiring width was set at 0.5 μm. As shown in the graph, the nonuniformity σ is stabilized at about 0.26 where the percentage of the H-type grain boundaries based on the total boundaries is not lower than 20%. Clearly, it is desirable for the percentage of the H-type grain boundaries to be not lower than 20%. It should be noted that the Al grain within the Al wiring has a diameter of about 0.5 μm and, thus, one or two H-type grain boundaries are present within 10 μm. It follows that at least 5% of the H-type boundaries are present based on the total grain boundaries within the wiring.

Table 1 shows the results of the EM testing applied to the samples of this Example together with the percentage of the H-type grain boundaries and MTF (mean time to failure). Table 1 also shows for comparison the data for the conventional damascene wiring and RIE wiring. The EM testing was conducted under a nitrogen atmosphere at 250° C. The applying current density J during the EM testing was set at 1.0 $MA/cm^2$.

TABLE 1

|  |  | H-type grain boundary (%) | MTF (h) | σ | Juse |
|---|---|---|---|---|---|
| Examples of present invention |  |  |  |  |  |
| (I-1) | N$_2$-added damascene | 32.1 | 23 | ◯ | ◯ |
| (I-2) | Nb film thickness deflection | 25.2 | 15 | ◯ | ◯ |
| (I-4) | cold/hot film thickness ratio | 30.5 | 17 | ◯ | ◯ |

TABLE 1-continued

|  |  | H-type grain boundary (%) | MTF (h) | σ | Juse |
|---|---|---|---|---|---|
| (I-5) | cold/hot Cu concentration deflection | 36.1 | 21 | ◯ | ◯ |
| (I-6) | recess of wiring | 48.9 | 15 | ◯ | ◯ |
| (I-7) | Al/liner/Al wiring | 53.1 | 19 | ◯ | ◯ |
| (I-8) | W via SD | 21.4 | 21 | ◯ | ◯ |
| (I-9) | Al pillar process | 27.5 | 24 | ◯ | ◯ |
| (I-10) | organic SOG/F doped SiO$_2$ | 33.4 | 34 | ◯ | ◯ |
| (I-11) | Cu concentration deflection | 32.1 | 31 | ◯ | ◯ |
| (I-12) | SiO$_2$ projection | 24.5 | 23 | ◯ | ◯ |
| (I-13) | collimator 45° | 28.2 | 24 | ◯ | ◯ |
| (I-14) | via formation first | 26.4 | 26 | ◯ | ◯ |
| reference | conventional damascene | 12.3 | 9 | 0.35 | 0.13 |
| reference | RIE | 0.0 | 8 | X | X |

The mark "◯" for each of σ and Juse in Table 1 denotes that the wiring for the Example of the present invention is superior to the conventional damascene wiring.

As shown in Table 1, the percentage of the H-type grain boundary contained in the conventional damascene wiring was 12.3% in contrast to 32.1% for the wiring of the sample obtained in Example I-1 of the present invention, i.e., wiring formed by N$_2$-added damascene. It is clearly shown that the wiring of the present invention is superior to the conventional damascene wiring in any of MTF, σ and Juse.

Incidentally, the H-type grain boundary is not present in the wiring formed by RIE. As a result, the wiring formed by RIE was found to be inferior to any of the other samples in MTF, σ and Juse, as apparent from Table 1.

Example I-2

An insulating layer and a lower wiring was formed successively on a silicon substrate, followed by depositing an interlayer insulating film on the entire surface, as in Example I-1. Further, a groove for forming an upper wiring was formed in the interlayer insulating film, as in Example I-1.

In the next step, a liner consisting of a Nb film was formed with a varied thickness not smaller than 5 nm. Then, a wiring and a via were formed on the interlayer insulating film as in Example I-1. Finally, a passivation layer was deposited on the interlayer insulating film as in Example 1.

Figure 8:
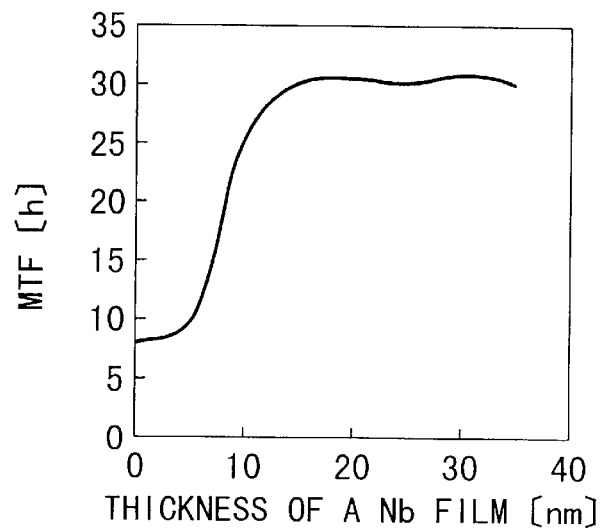
FIG. 8 is a graph showing the relationship between the thickness of a Nb film used as a liner for reflow sputtering material and MTF (median time to failure) in a semiconductor device of the present invention.

An EM stress testing was applied to each of the samples thus obtained under the conditions similar to those in Example I-1. FIG. 8 is a graph showing the experimental data relating to the relationship between the Nb film thickness and the MTF. As shown in the graph of FIG. 8, MTF can be improved by about 20% by setting the thickness of the Nb film used as a liner at 15 nm or more.

Further, Table 1 shows the percentage of the H-type grain boundary, MTF, σ, and Juse for the sample in which the Nb film thickness was set at 25 nm.

As apparent from Table 1, the sample obtained in Example I-2, in which the H-type grain boundary was contained in the wiring in an amount of 25.2%, was found to be superior to the conventional damascene wiring in any of MTF, σ, and Juse.

Example I-3

An insulating layer and a lower wiring (W, Al or Al alloy, Cu, Cu alloy) was formed successively on a silicon substrate, followed by depositing an interlayer insulating film on the entire surface, as in Example I-1. Further, a groove for forming an upper wiring was formed in the interlayer insulating film, as in Example I-1.

Then, a liner of any of Ti, Ta, TiN, TaAl, Ti/TiN, NbN, Nb/NbN/Nb, TaN, Ta/TaN/Ta was formed by a sputtering method. By changing the material of the liner, the Full width at half maximum (FWHM) of the Al (111) rocking curve by X-ray of Al used as a wiring material formed on the liner can be improved. As a result, it is possible to suppress the grain boundary diffusion of Al atoms so as to improve the EM endurance.

After formation of the liner, a wiring and a via were formed on the interlayer insulating film as in Example I-1. Further, a passivation layer was deposited as in Example I-1 so as to prepare samples. In the samples differing from each other in the liner material, the via hole and the wiring were filled completely with Al as in Example I-1.

It has been found from this experiment that a liner film having a thickness of at least 5 nm is effective for prolonging the life of the wiring.

Example I-4

An insulating layer and a lower wiring was formed successively on a silicon substrate, followed by depositing an interlayer insulating film on the entire surface, as in Example I-1. Further, a groove for forming an upper wiring was formed in the interlayer insulating film, followed by forming a liner film as in Example I-1.

The wiring was formed substantially as in Example I-1, though a ratio of the thickness of the Al film formed by deposition by LTS method to the thickness of the Al film deposited by the reflow sputtering method was changed. To be more specific, a first Al film as shown in FIG. 2D was formed by an LTS method in which the distance between the sputtering target and the silicon substrate was set at a sufficiently large value. In this step, the Al film thickness was set at a value at which the filling property is not lowered. Then, a second Al film was formed as shown in FIG. 3A by a reflow sputtering method while heating the silicon substrate.

After formation of the wiring by forming two kinds of the Al films, a passivation film was formed as in Example I-1 so as to obtain several kinds of samples.

The measured values of the electrical characteristics for each of these samples were substantially equal to those in Example I-1. It was found, however, that, if the thickness of the first Al film formed by the LTS method is small, the number of grain boundaries that are not perpendicular to the longitudinal direction of the wiring is increased in the bottom portion of the wiring.

Figure 9:
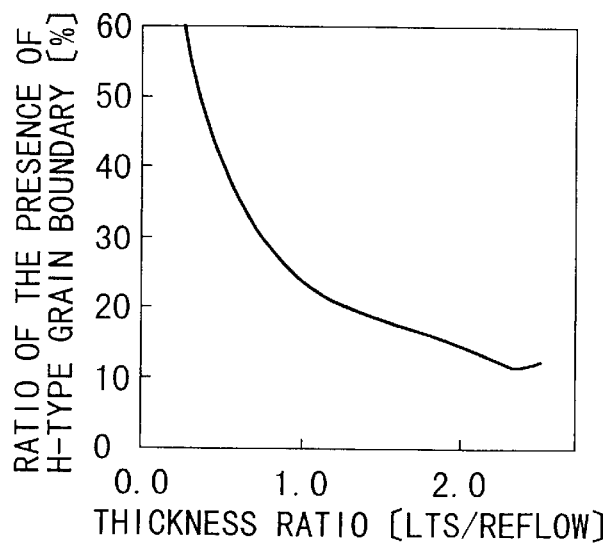
FIG. 9 is a graph showing the relationship between the ratio of presence of H-type grain boundary and the thickness ratio of wiring films in a semiconductor device of the present invention.

FIG. 9 is a graph showing the relationship between the film thickness ratio of the wiring, i.e., LTS/reflow, and the percentage of the H-type grain boundaries. As shown in FIG. 9, it is possible to control the number of grain boundaries within the wiring by changing the film thickness ratio. The burying properties in the reflow step was satisfactory so as to eliminate the nonuniformity in the wafer and the nonuniformity within the lot.

Table 1 shows the percentage of the H-type grain boundary, MTF, σ, and Juse for the sample in which the film thickness ratio (LTS/reflow) was set at 0.75.

As apparent from Table 1, the sample obtained in Example I-4, in which the H-type grain boundary was contained in the wiring in an amount of 30.5%, was found to be superior to the conventional damascene wiring in any of MTF, σ, and Juse.

Example I-5

An insulating layer and a lower wiring was formed successively on a silicon substrate, followed by depositing an interlayer insulating film on the entire surface, as in Example I-1. Further, a groove for forming an upper wiring was formed in the interlayer insulating film, followed by forming a liner film as in Example I-1.

In forming the wiring, a first Al(Cu) film was deposited by the LTS method using Al(Cu) as a sputtering target, followed by forming a second Al(Cu) film by a reflow sputtering method. The Al(Cu) target used in the LTS method differed from that used in the reflow sputtering method in the Cu concentration.

An interface derived from the difference in the Cu concentration was formed between the two Al(Cu) films formed by using the targets differing from each other in the Cu concentration. The interface, which produces an effect similar to that produced by the H-type grain boundary, served to decrease the nonuniformity in the defective wiring.

After formation of the wiring by forming the two Al(Cu) films differing from each other in the Cu concentration, a passivation film was formed as in Example I-1 so as to obtain several kinds of samples.

Table 1 shows the percentage of the H-type grain boundary, MTF, σ, and Juse for the sample in which the Cu concentration ratio (LTS/reflow) was set at 0.75.

As apparent from Table 1, the sample obtained in Example I-5, in which the H-type grain boundary was contained in the wiring in an amount of 36.1%, was found to be superior to the conventional damascene wiring in any of MTF, σ, and Juse.

Example I-6

Figure 10A:
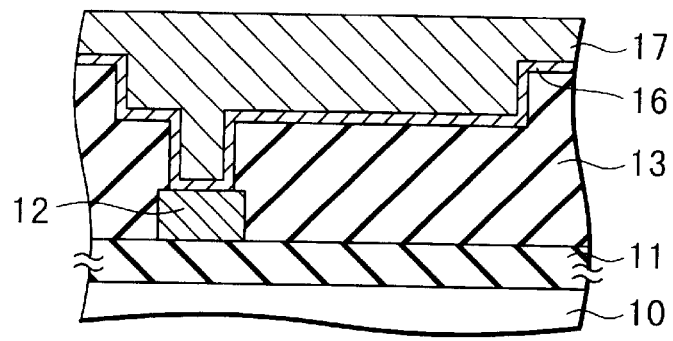
FIGS. 10A to 10D are cross sectional views collectively illustrating another example of a method of the present invention for manufacturing a semiconductor device of the present invention.
Figure 10B:
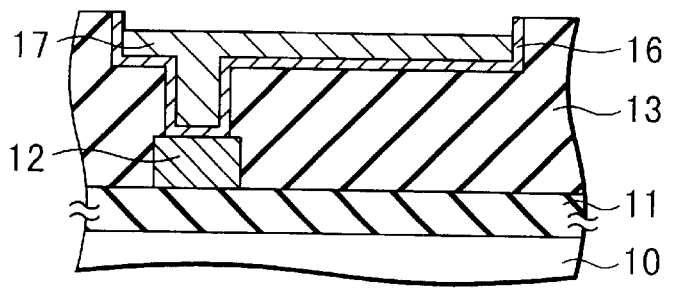

An insulating layer 11, a lower wiring layer 12 and an interlayer insulating film 13 were successively formed on a silicon substrate 10 as in Example I-1. Then, a liner 16 and an Al film 17 were formed on the interlayer insulating film 13 as in Example I-1, followed by forming a recess in the upper wiring as shown in FIG. 10B.

Figure 10C:
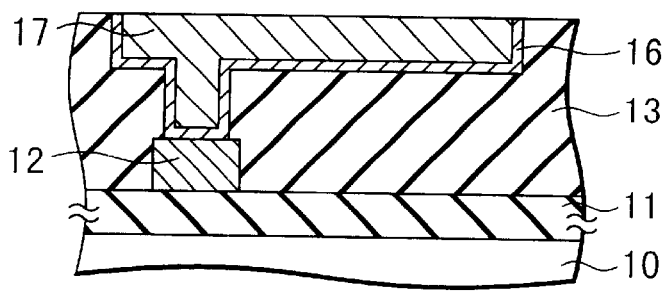
Figure 10D:
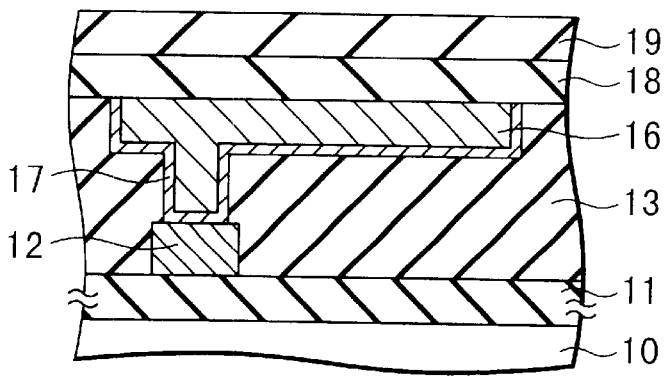

Further, Al was deposited again in the recessed portion by a sputtering method to form grain boundaries extending in the longitudinal direction of the wiring, followed by flattening the surface by CMP as shown in FIG. 10C. Finally, a SiO$_2$ film 18 and a SiN film 19 were deposited to form a passivation layer as shown in FIG. 10D, thereby preparing a sample of Example I-6.

Table 1 shows the percentage of the H-type grain boundary, MTF σ, and Juse for the sample thus prepared.

As apparent from Table 1, the sample obtained in Example I-6, in which the H-type grain boundary was contained in the wiring in an amount of 48.9%, was found to be superior to the conventional damascene wiring in any of MTF, σ, and Juse.

Example I-7

Figure 11A:
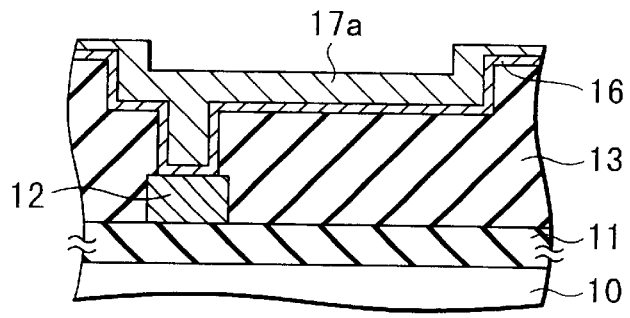
FIGS. 11A to 11E are cross sectional views collectively illustrating another example of a method of the present invention for manufacturing a semiconductor device of the present invention.

An insulating layer 11, a lower wiring layer 12 and an interlayer insulating film 13 were successively formed on a silicon substrate 10 as in Example I-1. Then, a liner 16 was deposited on the interlayer insulating film 13 as in Example I-1, followed by forming a first Al film 17a by the LTS method, as shown in FIG. 11A. The first Al film 17a was deposited not to fill completely the groove in view of a liner and a second Al film which are to be deposited later on the Al film 17a.

Figure 11B:
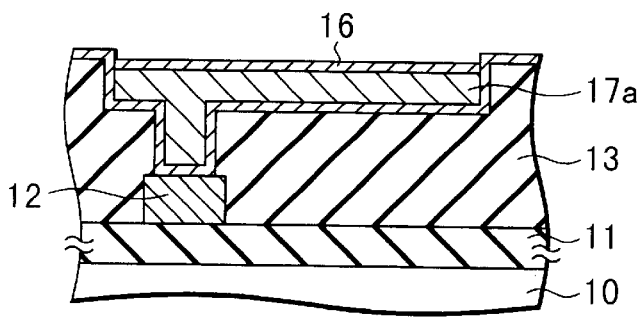
Figure 11C:
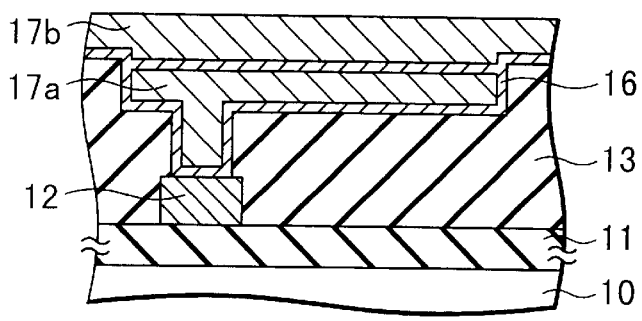

In the next step, a liner 16 was formed on the entire surface by a sputtering method, as shown in FIG. 11B, followed by forming a second Al film 17b on the liner 16 by a reflow sputtering method, as shown in FIG. 11C. As a result, formed in the Al wiring is an Al/(reaction product of liner and Al)/Al interface. The interface thus formed produces the effect of suppressing the nonuniformity of the defective wiring like the H-type grain boundary.

Figure 11D:
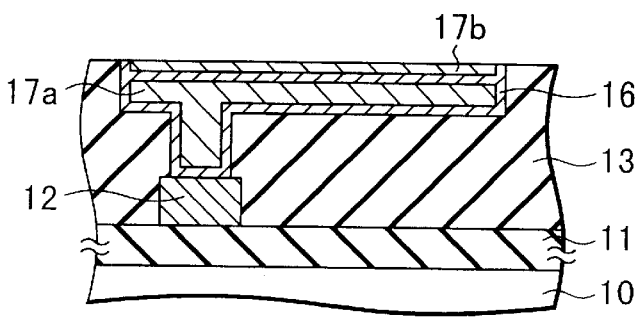
Figure 11E:
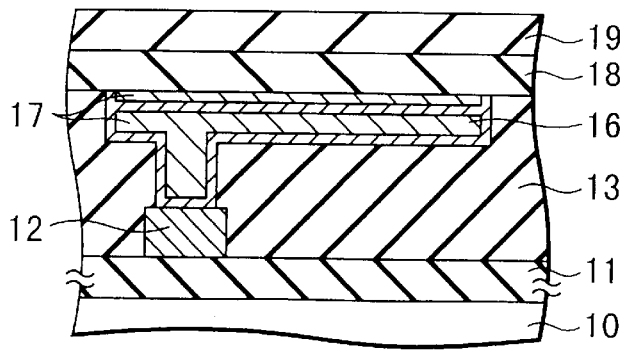

Then, the surface was flattened by CMP as shown in FIG. 11D so as to form an Al wiring. Finally, a passivation layer was formed by depositing a SiO$_2$ film 18 and a SiN film 19 on the Al wiring, as shown in FIG. 11E, so as to obtain a sample of Example I-7.

Table 1 shows the percentage of the H-type grain boundary, MTF, σ, and Juse for the sample thus prepared.

As apparent from Table 1, the sample obtained in Example I-7, in which the H-type grain boundary was contained in the wiring in an amount of 53.1%, was found to be superior to the conventional damascene wiring in any of MTF, σ, and Juse.

Example I-8

Figure 12A:
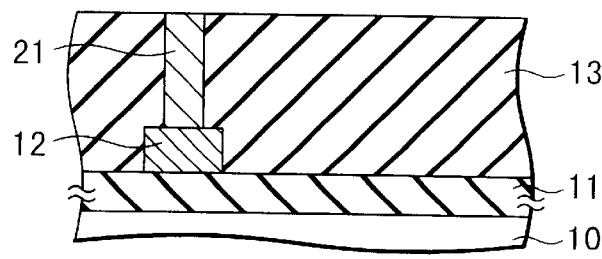
FIGS. 12A to 12C are cross sectional views collectively illustrating another example of a method of the present invention for manufacturing a semiconductor device of the present invention.
Figure 12B:
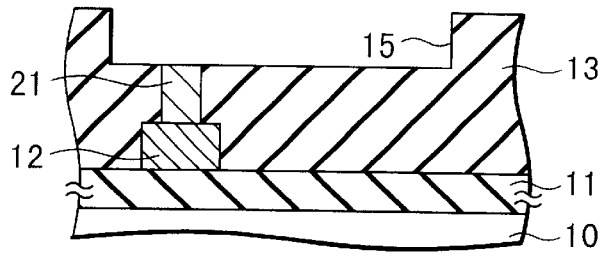
Figure 12C:
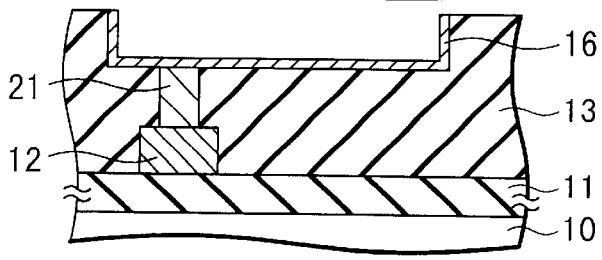

An insulating layer 11, a lower wiring layer 12 and an interlayer insulating film 13 were successively formed on a silicon substrate 10 as in Example I-1. Then, a via hole was formed in the interlayer insulating film 13, followed by forming a tungsten via 21 as shown in FIG. 12A. The tungsten via can be formed by a blanket W-CVD method or a selective W-CVD method. Then, a groove 15 for an upper wiring was formed as shown in FIG. 12B, followed by forming a Nb liner 16 on the entire surface within the groove by a sputtering method, as shown in FIG. 12C.

Figure 13A:
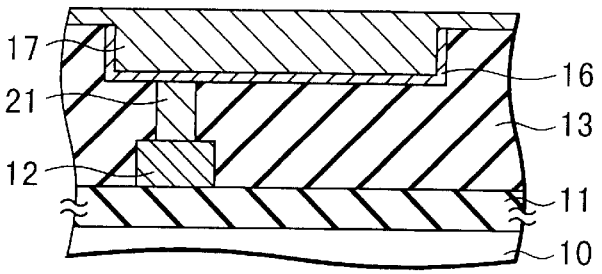
FIGS. 13A and 13C are cross sectional views collectively illustrating another example of a method of the present invention for manufacturing a semiconductor device of the present invention.
Figure 13B:
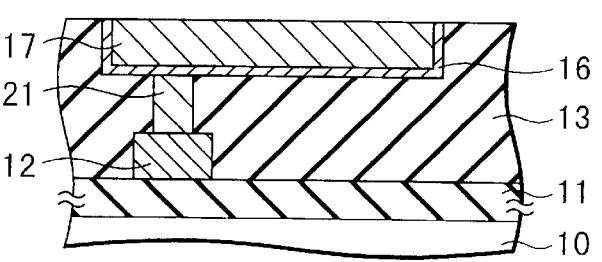

Further, an Al layer 17 was deposited by the LTS method as shown in FIG. 13A, followed by flattening the surface by CMP to form a wiring, as shown in FIG. 13B.

Figure 13C:
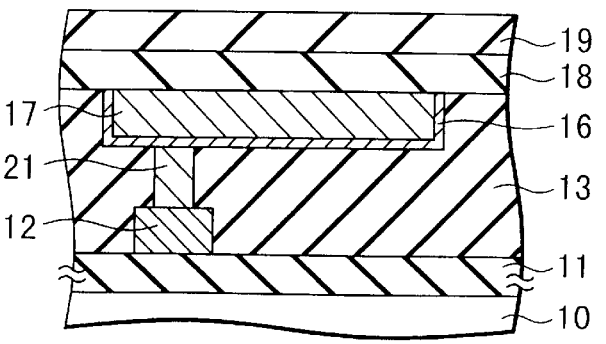

Finally, a passivation layer was formed by depositing a SiO$_2$ film 18 and a SiN film 19 on the wiring as shown in FIG. 13C, followed by applying an annealing treatment to obtain a sample of Example 1-8.

Table 1 shows the percentage of the H-type grain boundary, MTF, σ, and Juse for the sample thus prepared.

As apparent from Table 1, the sample obtained in Example I-8, in which the H-type grain boundary was contained in the wiring in an amount of 21.4%, was found to be superior to the conventional damascene wiring in any of MTF, σ, and Juse.

Example I-9

Figure 14A:
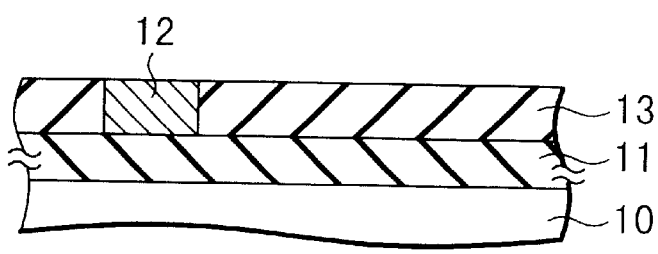
FIGS. 14A to 14D are cross sectional views collectively illustrating another example of a method of the present invention for manufacturing a semiconductor device of the present invention.
Figure 14B:
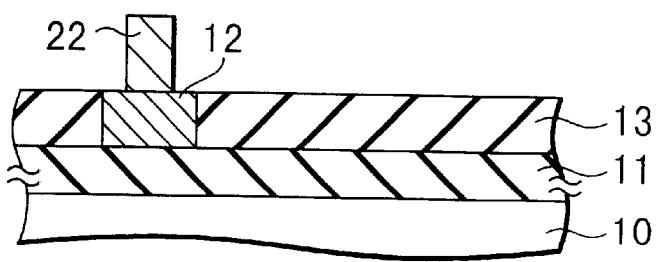
Figure 14C:
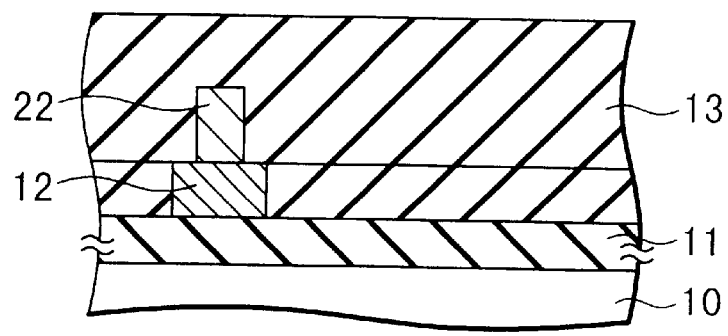
Figure 14D:
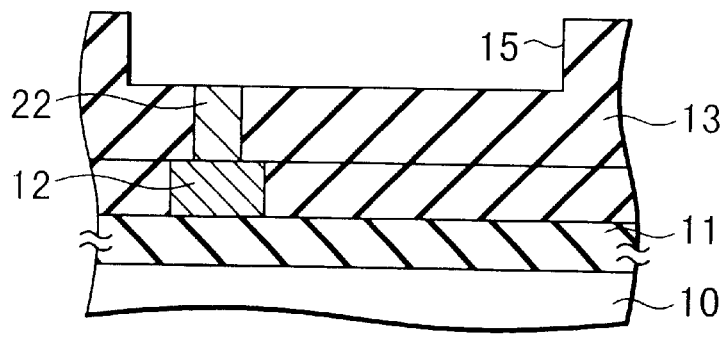
Figure 15A:
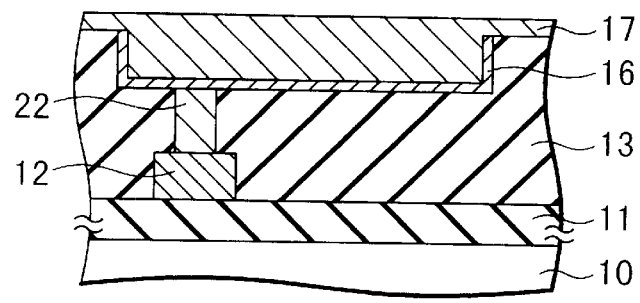
FIGS. 15A to 15C are cross sectional views collectively illustrating another example of a method of the present invention for manufacturing a semiconductor device of the present invention.
Figure 15B:
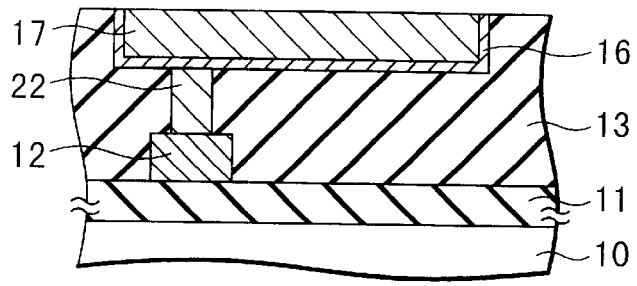

An insulating layer 11 and a lower wiring 12 were successively formed on a substrate 10 as in Example I-1, followed by depositing a SiO₂ film 13 as shown in FIG. 14A. Then, a via 22 was formed by a pillar process using tungsten or Al, as shown in FIG. 14B, followed by depositing an interlayer insulating film 13 as shown in FIG. 14C. Further, a groove 15 for an upper wiring was formed in the interlayer insulating film 13, as shown in FIG. 14D. Still further, a Nb liner 16 was formed on the entire surface within the groove by a sputtering method, followed by forming an Al film 17 by the LTS method, as shown in FIG. 15A. The Al film 17 thus formed was flattened by CMP so as to form a wiring as shown in FIG. 15B.

Figure 15C:
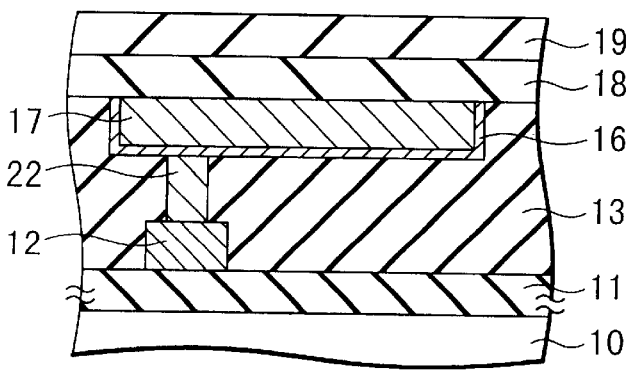

Finally, a passivation layer was formed by depositing a SiO₂ film 18 and a SiN film 19 on the wiring as shown in FIG. 15C, followed by applying an annealing treatment to obtain a sample of Example I-9.

Table 1 shows the percentage of the H-type grain boundary, MTF, σ, and Juse for the sample thus prepared.

As apparent from Table 1, the sample obtained in Example I-9, in which the H-type grain boundary was contained in the wiring in an amount of 27.5%, was found to be superior to the conventional damascene wiring in any of MTF, σ, and Juse.

Example I-10

A sample was prepared as in Example I-1, except that a passivation layer was formed by successively depositing an organic SOG film and a fluorine-doped SiO₂ film on the wiring.

Table 1 shows the percentage of the H-type grain boundary, MTF, σ, and Juse for the sample thus prepared.

As apparent from Table 1, the sample obtained in Example I-10, in which the H-type grain boundary was contained in the wiring in an amount of 33.4%, was found to be superior to the conventional damascene wiring in any of MTF, σ, and Juse.

Example I-11

Various samples were prepared as in Example I-1, except that Cu was contained in the wiring material and the Cu concentration of the wiring material was changed in various fashions.

Figure 16:
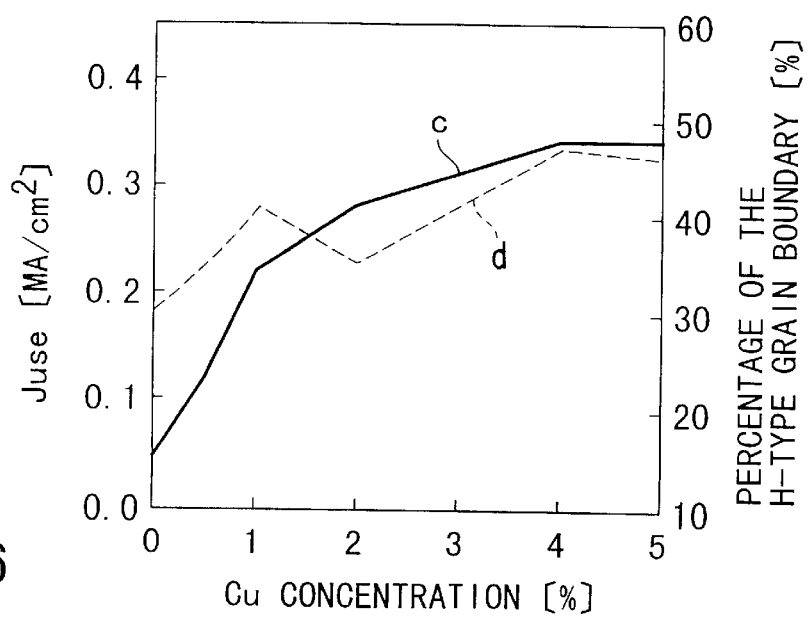
FIG. 16 is a graph showing the relationship between the copper concentration in the wiring and Juse (Use current density from a EM reliability point of view at LSI operating condition) and the relationship between the copper concentration and the percentage of the H-type grain boundary in a semiconductor device of the present invention.

FIG. 16 is a graph showing the relationship between the Cu concentration in the wiring material and Juse and the relationship between the Cu concentration and the percentage of the H-type grain boundary. Curve c in the graph of FIG. 16 represents Juse, with curve d representing the percentage of the H-type grain. As shown in the graph, the percentage of the H-type grain boundary is about 45 to 50% regardless of the Cu concentration, supporting that the nonuniformity of the defective wiring was small and, thus, the wiring was satisfactory. On the other hand, MTF has a longer life, compared with a sample of a low Cu concentration. As a result, the calculated allowable current density is increased with increase in the Cu concentration in the Al wiring.

Table 1 also shows the percentage of the H-type grain boundary, MTF, σ, and Juse in respect of the sample having 1% of Cu concentration.

As shown in Table 1, the sample obtained in Example I-11, in which the H-type grain boundary was contained in the wiring in an amount of 32.1%, was found to be superior to the conventional damascene wiring in any of MTF, σ, and Juse.

Example I-12

Figure 17A:
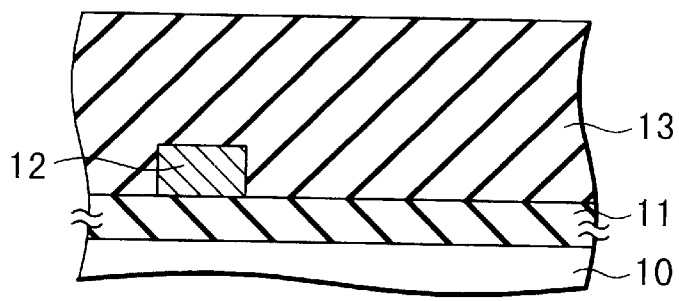
FIGS. 17A to 17D are cross sectional views collectively illustrating another example of a method of the present invention for manufacturing a semiconductor device of the present invention.
Figure 17B:
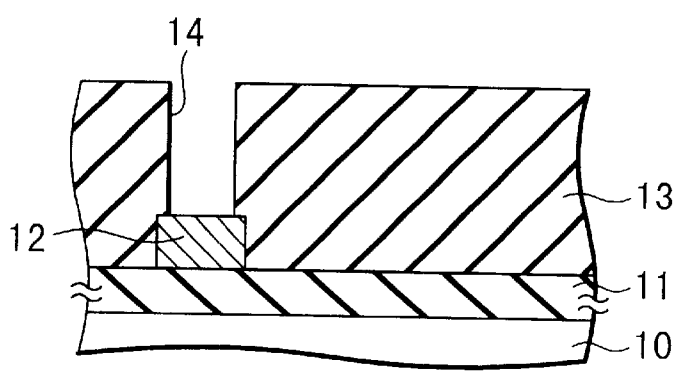
Figure 17C:
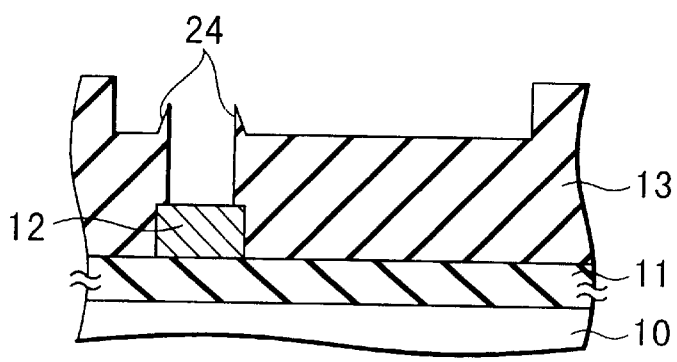

An insulating layer 11, a lower wiring layer 12 and an interlayer insulating film 13 were successively formed on a silicon substrate 10 as in Example I-1, as shown in FIG. 17A. Then, a via hole 14 was formed in the interlayer insulating film 13, as shown in FIG. 17B. When a groove for an upper wiring was formed in the interlayer insulating film 13, the etching conditions were changed to form a protrusion 24 at the interlayer insulating film, as shown in FIG. 17C. It is possible to form the protrusion 24 in a height of about 500 Å and a width of about 300 Å around the via hole 14.

Figure 17D:
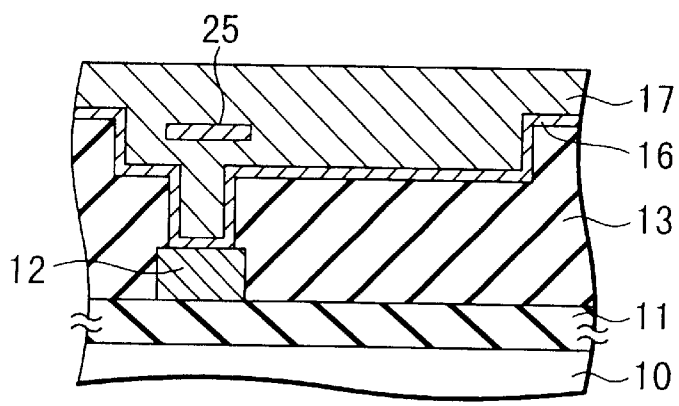

Then, a liner 16 was formed as in Example I-1, followed by forming an Al film 17 by the LTS method, as shown in FIG. 17D. After formation of the Al film 17, a grain boundary 25 making an angle not larger than 60° with the substrate surface was formed right above the via portion. The grain boundary 25 was formed under the influence given by the protrusion 24 formed on the interlayer insulating film 13.

Figure 18A:
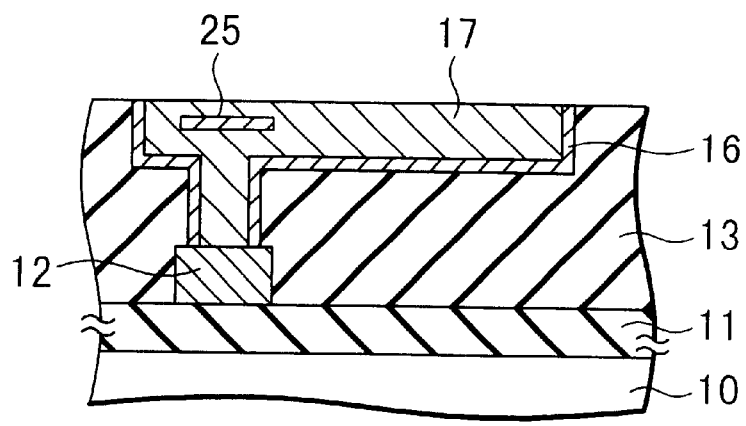
FIGS. 18A to 18C are cross sectional views collectively illustrating another example of a method of the present invention for manufacturing a semiconductor device of the present invention.
Figure 18B:
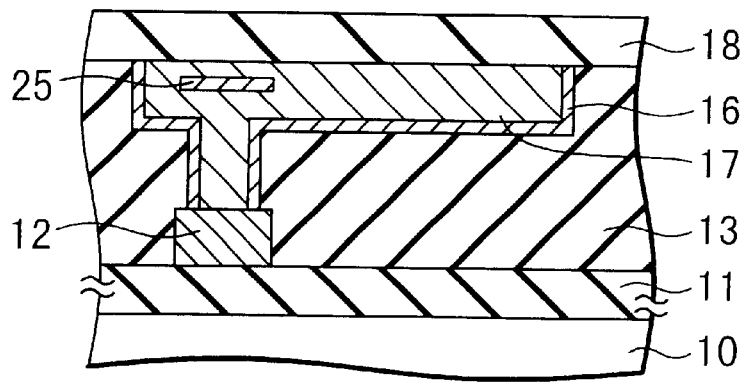
Figure 18C:
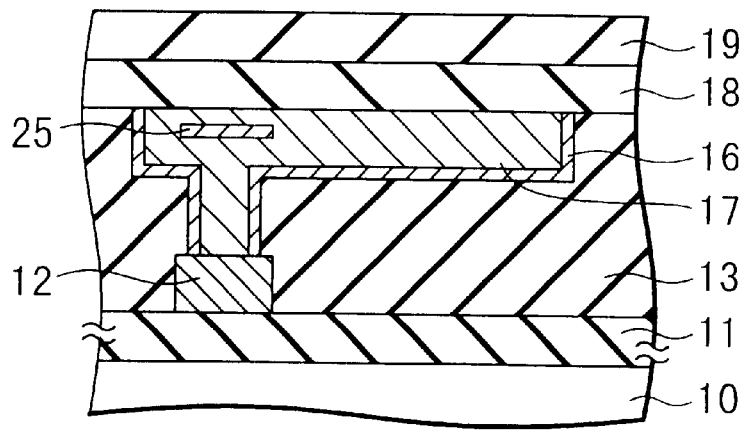

Then, a wiring was formed by flattening the surface of the Al film 17 as shown in FIG. 18A, followed by forming a SiO₂ film 18 on the wiring as shown in FIG. 18B. Finally, a SiN film 19 was deposited to form a passivation layer, as shown in FIG. 18C, thereby obtaining a sample of Example I-12.

Table 1 also shows the percentage of the H-type grain boundary, MTF, σ, and Juse in respect of the sample thus prepared.

As shown in Table 1, the sample obtained in Example I-12, in which the H-type grain boundary was contained in the wiring in an amount of 24.5%, was found to be superior to the conventional damascene wiring in any of MTF, σ, and Juse.

Example I-13

Figure 19A:
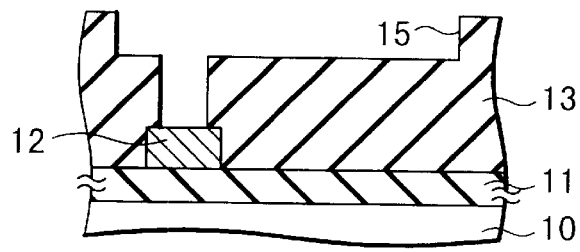
FIGS. 19A to 19E are cross sectional views collectively illustrating another example of a method of the present invention for manufacturing a semiconductor device of the present invention.

An insulating layer 11, a lower wiring layer 12 and an interlayer insulating film 13 were successively formed on a silicon substrate 10 as in Example I-1. Then, a via hole 14 and a groove 15 for an upper wiring were formed in the interlayer insulating film 13, as shown in FIG. 19A.

Figure 19B:
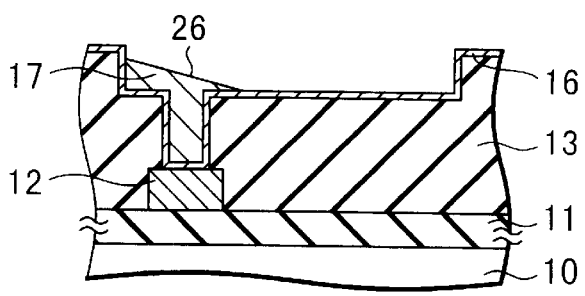

Then, a liner 16 was formed by forming a Nb layer on the entire surface of the interlayer insulating film 13 by a sputtering method, followed by forming a first Al film by the LTS method. In this step, the angle of the collimator included in the sputtering apparatus was set to fall within a range of between 30° and 60° so as to form the first Al film in an oblique direction relative to the wafer. As a result, a grain boundary 26 extending in a longitudinal direction and making an angle not larger than 60° with the substrate surface was formed in a manner to extend from above the via toward the via, as shown in FIG. 19B. Since the Nb liner 16 around the via has a thickness of about 10 nm, the resistance of the wiring was not increased.

Figure 19C:
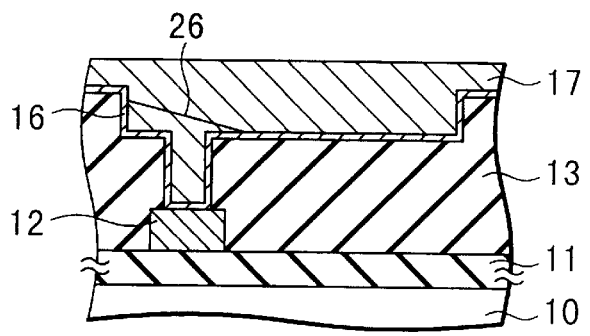
Figure 19D:
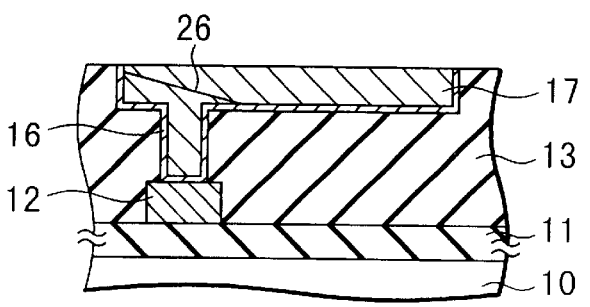
Figure 19E:
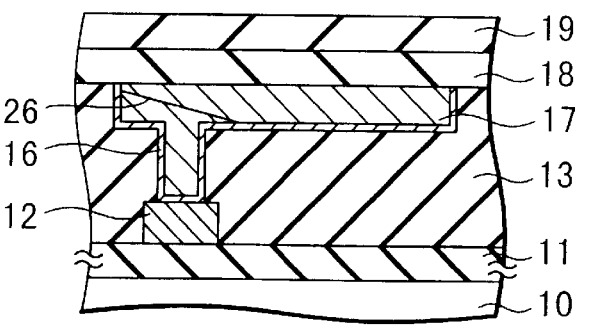

In the next step, a reflow sputtering was applied so as to form a second Al film, as shown in FIG. 19C. Further, the surface of the Al film was flattened by CMP as in Example I-1 so as to form a wiring. Finally, a SiO₂ film 18 and a SiN film 19 were successively deposited to form a passivation layer as shown in FIG. 19E, thereby obtaining a sample of Example I-13.

Table 1 also shows the percentage of the H-type grain boundary, MTF, σ, and Juse in respect of the sample thus prepared.

As shown in Table 1, the sample obtained in Example I-13, in which the H-type grain boundary was contained in the wiring in an amount of 28.2%, was found to be superior to the conventional damascene wiring in any of MTF, σ, and Juse.

Figure 20A:
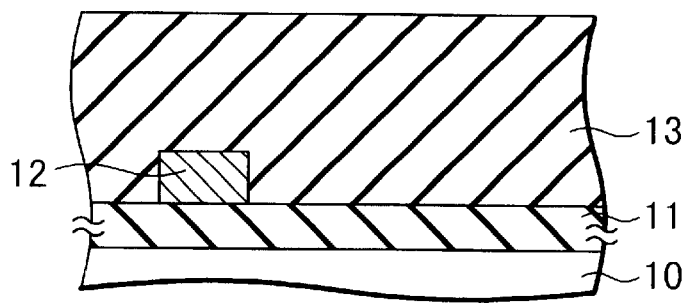
FIGS. 20A to 20D are cross sectional views collectively illustrating another example of a method of the present invention for manufacturing a semiconductor device of the present invention.
Figure 20B:
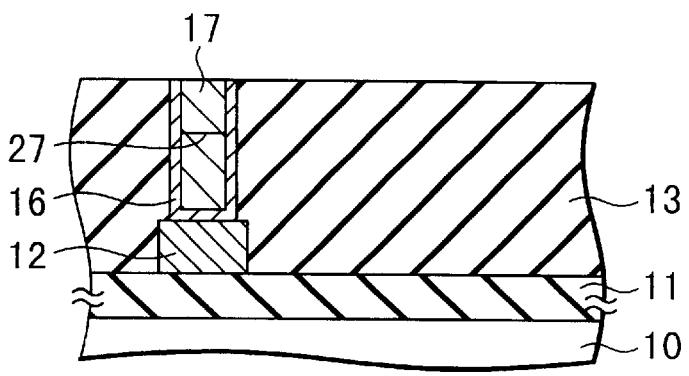

Example I-14:

An insulating layer 11, a lower wiring layer 12 and an interlayer insulating film 13 were successively formed on a silicon substrate 10 as in Example I-1, as shown in FIG. 20A. Then, a via hole 14 was formed in the interlayer insulating film 13, followed by forming a Nb liner 16 on the entire surface of the interlayer insulating film 13 by a sputtering method. Further, an Al film 17 was formed by deposition by a sputtering method. The grain diameter of Al was found to be about 0.5 $\mu$m, and at least two Al grains were formed in upper and lower regions of the via, as shown in FIG. 20B. Each of these grain boundaries made an angle not larger than 60° with the substrate surface.

Figure 20C:
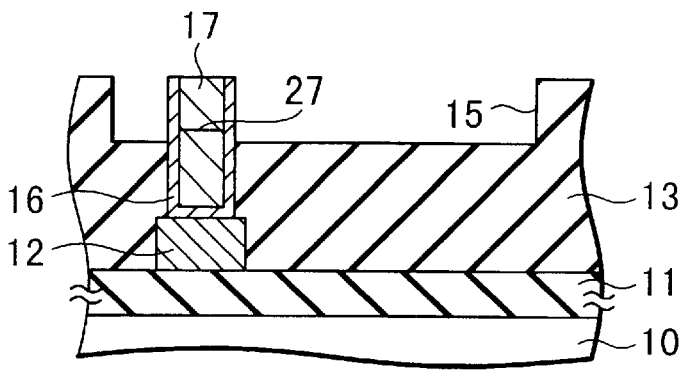
Figure 20D:
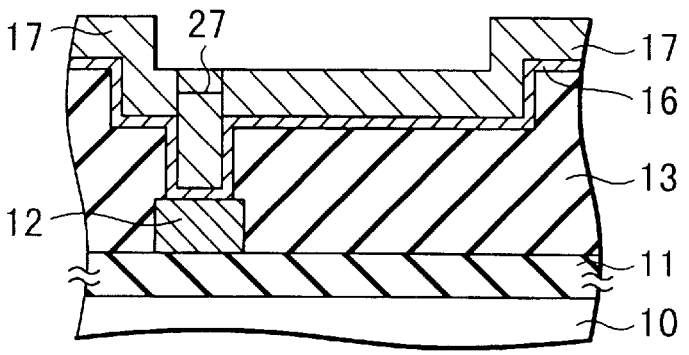
Figure 21A:
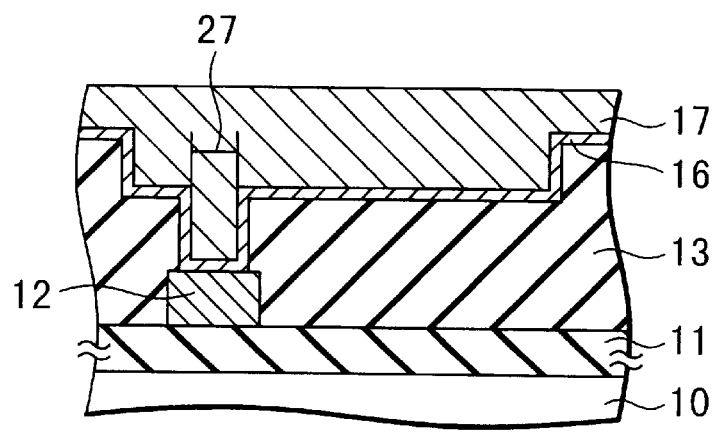
FIGS. 21A to 21C are cross sectional views collectively illustrating another example of a method of the present invention for manufacturing a semiconductor device of the present invention.
Figure 21B:
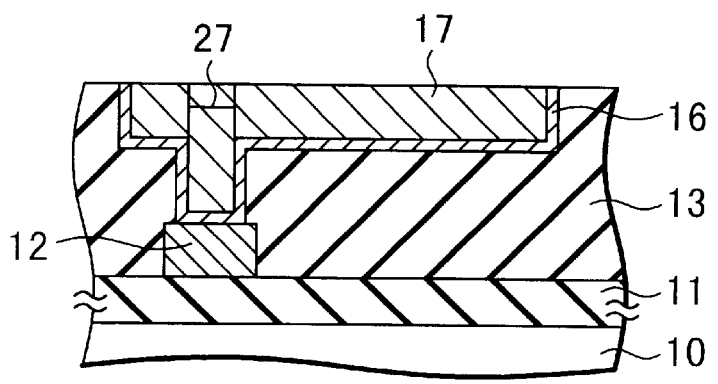
Figure 21C:
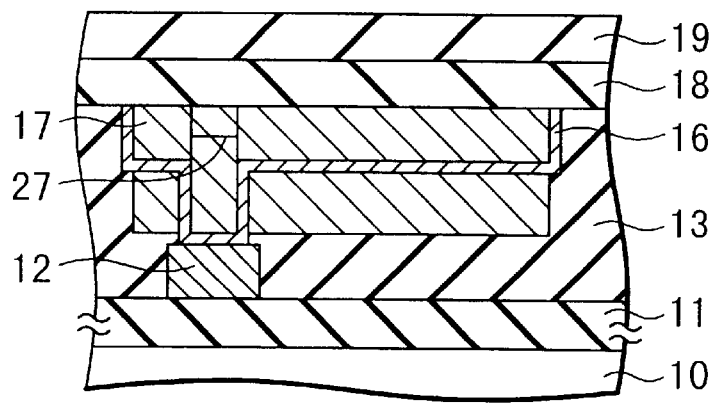

In the next step, a groove 15 for an upper wiring was formed as shown in FIG. 20C, followed by forming a Nb liner 16 by a sputtering method within the groove 15 as shown in FIG. 20D. Then, a reflow sputtering was applied so as to deposit Al and, thus, to form an Al film 17, as shown in FIG. 21A. Further, the surface of the Al film was flattened by CMP so as to form a wiring, as shown in FIG. 21B. Finally, a $SiO_2$ film 18 and a SiN film 19 were successively deposited as in Example I-1 to form a passivation layer as shown in FIG. 21C, thereby obtaining a sample of Example I-14.

Table 1 also shows the percentage of the H-type grain boundary, MTF, $\sigma$, and Juse in respect of the sample thus prepared.

As shown in Table 1, the sample obtained in Example I-14, in which the H-type grain boundary was contained in the wiring in an amount of 26.4%, was found to be superior to the conventional damascene wiring in any of MTF, $\sigma$, and Juse.

The method of manufacturing the semiconductor device of Example I described above is particularly effective for forming a multi-layer wiring. However, the particular method can also be applied for forming a single layer structure, with substantially the same effects. Incidentally, it is not absolutely necessary to form the liner in the bottom portion and the side wall portion of the wiring.

EXAMPLE II

Example II-1

FIGS. 22A to 22D and 23A to 23D collectively show a method of manufacturing a semiconductor device of this example.

Figure 22A:
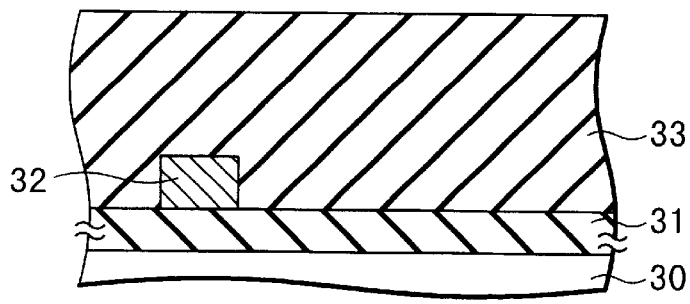
FIGS. 22A to 22D are cross sectional views collectively illustrating another example of a method of the present invention for manufacturing a semiconductor device of the present invention.
Figure 22B:
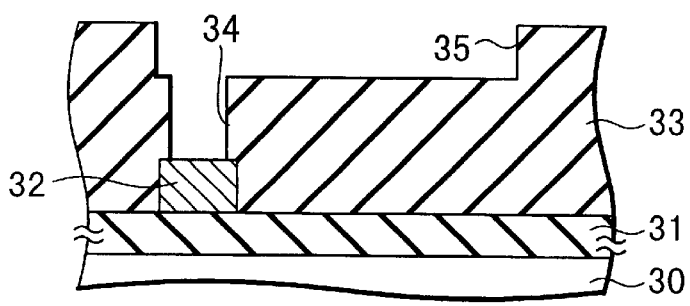
Figure 22C:
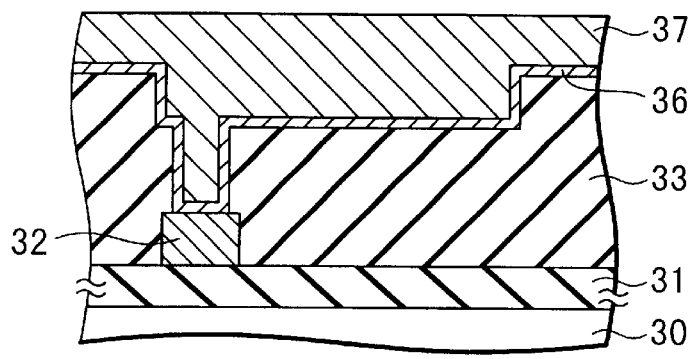

In the first step, an insulating layer 31 and a lower wiring 32 were successively formed on a semiconductor substrate 30, as shown in FIG. 22A, followed by forming a TEOS film 33 as an interlayer insulating film on the entire surface. Then, a groove 35 for forming a via hole 34 and an upper wiring was formed in the interlayer insulating film, as shown in FIG. 22B.

Figure 22D:
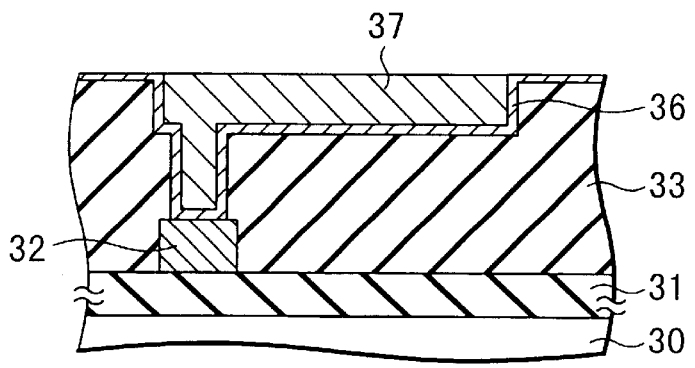

Further, after formation of a liner 36, Al was deposited within the groove for the via hole and the upper wiring by a reflow sputtering so as to form an Al film 37. The liner 36 can be made of Ti, TiN, Nb, Ta, TaAl, Ti/TiN, NbN, Nb/NbN/Nb, TaN or Ta/TaN/Ta. Then, the surface of the Al film 37 was flattened by CMP to form the via and the upper wiring, as shown in FIG. 22D.

Figure 23A:
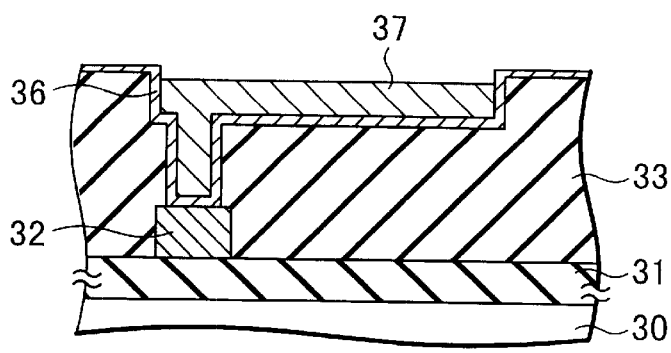
FIGS. 23A to 23D are cross sectional views collectively illustrating another example of a method of the present invention for manufacturing a semiconductor device of the present invention.
Figure 23B:
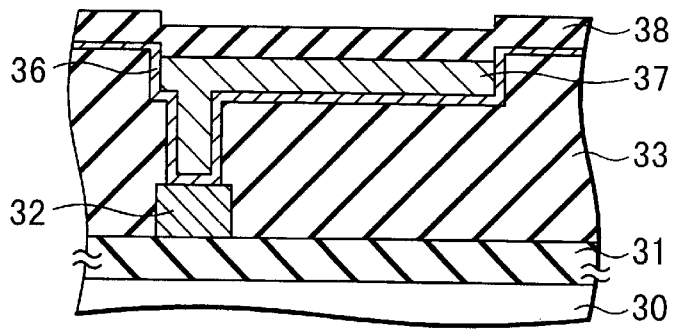

Then, the resultant upper wiring was recessed to remove the upper wiring portion in a thickness not smaller than 50 Å, as shown in FIG. 23A, followed by forming an intermediate layer 38 containing Al—Si—O by a sputtering method, as shown in FIG. 23B. It has been found by the element analysis that the intermediate layer 38 contained 4 to 15 atomic % of Al, 5 to 25 atomic % of Si and 70 to 80 atomic % of O. Also the intermediate layer of the particular composition can be formed by a CVD method using a raw material gas containing Al—Si—O.

Figure 23C:
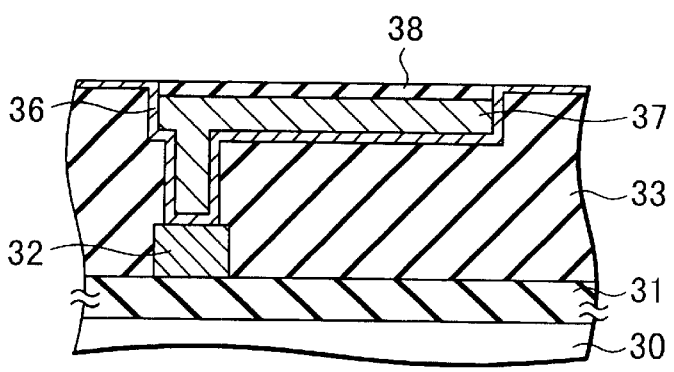

A CMP treatment was applied again to permit the intermediate layer 38 to remain selectively on only the upper portion of the wiring, as shown in FIG. 23C. Finally, a TEOS oxide film 39 and a SiN film 40 were successively deposited to form a passivation layer, thereby obtaining a sample of Example II-1.

Table II shows the results of the EM testing applied to the resultant sample. Table 2 also shows data in the case of the conventional structure in which the intermediate layer was not included and data in the case where the material of the intermediate layer was changed.

TABLE 2

| inter-mediate layer | insulating layer (Young's modulus) | average life (hours) under accelerating test | activation energy (eV) |
|---|---|---|---|
| none | TEOS-$SiO_2$ (60GPa) | 44 | 0.68 |
| formed | TEOS-$SiO_2$ (60GPa) | 75 | 0.90 |
| formed | fluorine-added $SiO_2$ (42GPa) | 86 | 0.92 |
| formed | organic SOG (8GPa) | 131 | 1.08 |

In the sample of the present invention shown in Table 2, the intermediate layer 38 is interposed between the upper portion of the wiring and the passivation layer. The intermediate layer thus formed permits improving the adhesion between the Al wiring and the passivation layer (TEOS-$SiO_2$ film). As a result, dominant Al diffusion changes to bulk diffusion so as to increase the activation energy of EM to 0.9 to 1.2 eV. It follows that a high EM reliability can be obtained in the multi-layer wiring structure of the present invention.

The semiconductor device of this example can be modified in various fashions. For example, it is possible for the intermediate layer to contain carbon in addition to the elements pointed out previously. It is also possible to use an Al-based alloy for forming the wiring. In this case, another alloying constituent is contained in the intermediate layer in addition to Al—Si—O or Al—Si—O—C. In any of these cases, it is possible to obtain the effect similar to that described above.

Example II-2

Figure 23D:
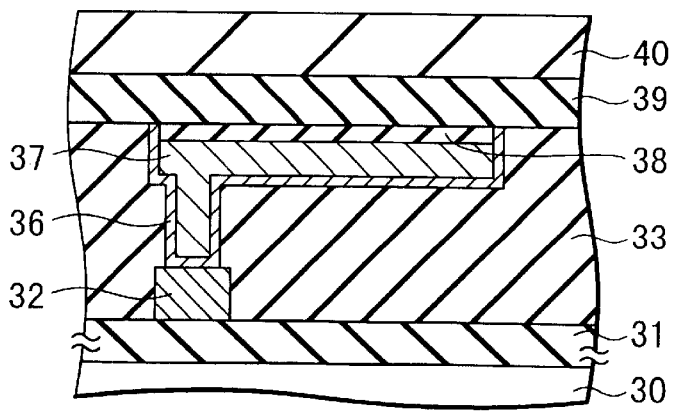

A sample was prepared as in Example II-1, except that a silicon oxide film containing an organic group formed by spin coating (organic SOG film) was formed as a passivation layer in place of the TEOS/SiN film shown in FIG. 23D. The organic SOG film used in this example was found to have a Young's modulus not larger than 50 GPa.

During the EM testing, the metal atoms constituting the wiring are migrated from the cathode (−) toward the anode (+). In this case, the density of the metal atoms is decreased and a tensile stress is generated in the cathode side of the wiring. Voids are generated if the tensile stress exceeds a critical point. It follows that the EM life can be prolonged by alleviating the generation of the tensile stress.

In order to examine the influences given by the material of the insulating layer, the hardness of each of the TEOS- SiO$_2$ film and the organic SOG film was measured by using an indentation hardness meter. Since the hardness is proportional to the Young's modulus in the elastic deformation region, the hardness was determined on the basis of the ratio of the Young's modulus of the TEOS-SiO$_2$ film to that of the organic SOG film with the Young's modulus of the thermal silicon oxide film (73 GPa) used as a reference. The Young's modulus of TEOS-SiO$_2$ film was found to be 60 GPa, and that of the organic SOG film was found to be 8 GPa. Clearly, the Young's modulus for the organic SOG film is markedly smaller than that for the TEOS-SiO$_2$ film. As a result, the organic SOG film produces a prominent effect of inhibiting the tensile stress acting on the cathode side during the EM testing, compared with the TEOS film.

Table 2 shows the results of the EM testing applied to the sample obtained in this example.

In this example, an insulating layer having a Young's modulus not larger than 50 GPa is used as a passivation film. Further, the intermediate layer is interposed between the insulating layer and the wiring layer. What should be noted is that the MTF (median time to failure) of EM is prolonged, with the result that the improvement in the activation energy produced by the presence of the intermediate layer is combined with the prolonged MTF, leading to a further increase in the effect of improving the EM endurance.

The particular effect described above can be obtained because an optional material having a Young's modulus not larger than 50 GPa is used as a passivation layer and the passivation layer is brought into contact with the wiring with the intermediate layer interposed therebetween. The materials that can be used in the present invention for forming the passivation layer include, for example, a silicon oxide-based film containing an organic group formed by employing a CVD method, a deposition polymerization, a sputtering method or a spin-coating method employed in this example, an organic film a typical example of which is a polyimide film, and a silicon oxide film containing an inorganic additive.

Example II-3

An insulating layer having a Young's modulus not larger than 50 GPa described in Example II-2 can be formed not only on the upper portion of the wiring but also on the side surface.

A semiconductor device of the particular construction, which was prepared in this example, will now be described with reference to FIGS. 24A to 24D and 25A to 25D.

Figure 24A:
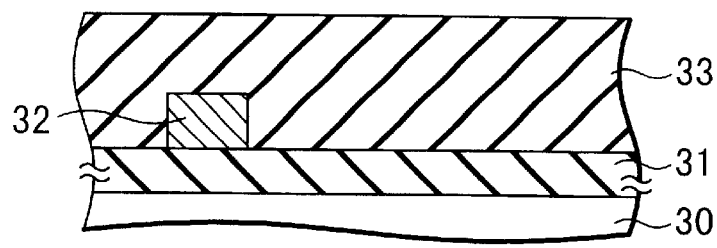
FIGS. 24A to 24D are cross sectional views collectively illustrating another example of a method of the present invention for manufacturing a semiconductor device of the present invention.
Figure 24B:
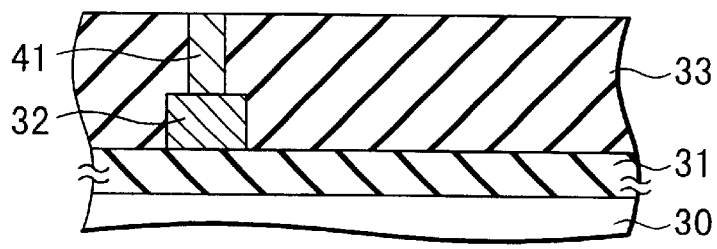

In the first step, an insulating layer 31 and a lower wiring 32 were successively formed on a substrate 30, as shown in FIG. 24A, followed by forming a TEOS film 33 as an interlayer insulating film on the entire surface. Then, a via hole was formed for forming a via 41, as shown in FIG. 24B. The via 41 can be formed by, for example, a selective W-CVD method, a blanket W-CVD method, or an Al single damascene method.

Figure 24C:
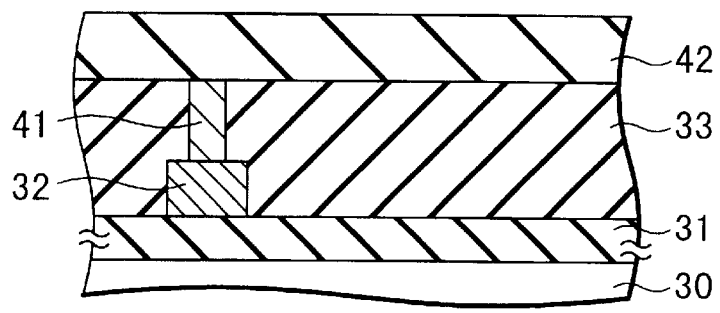
Figure 24D:
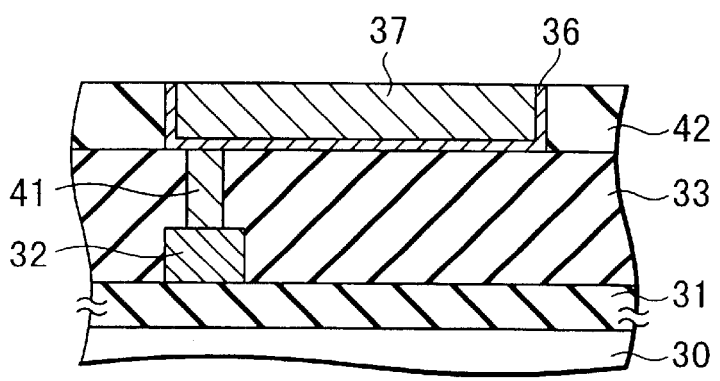

Further, an organic SOG film 42 was deposited as shown in FIG. 24C. The Young's modulus of this organic SOG film was not larger than 50 GPa. A groove for forming an upper wiring was formed within the organic SOG film 42, followed by successively forming within the groove a liner 36 and an Al film 37 constituting the upper wiring. The material of the liner 36 and the method of forming the Al film 37 were equal to those in Example II-1. Further, the surface was flattened by CMP to form the upper wiring, as shown in FIG. 24D.

Figure 25A:
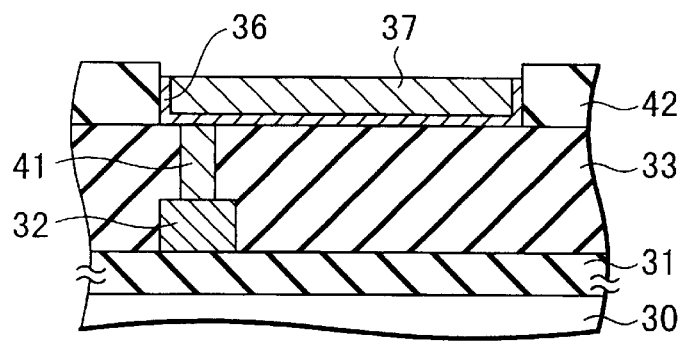
FIGS. 25A to 25D are cross sectional views collectively illustrating another example of a method of the present invention for manufacturing a semiconductor device of the present invention.
Figure 25B:
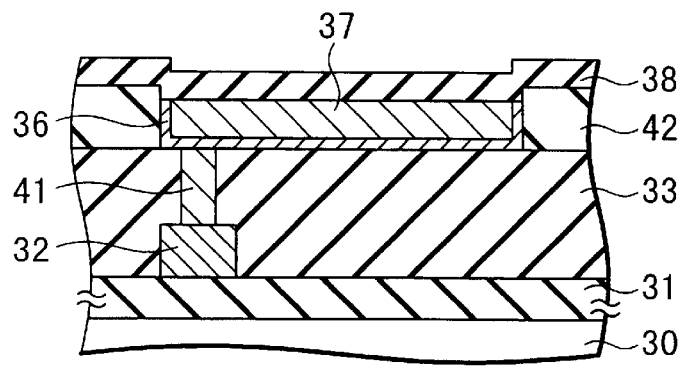
Figure 25C:
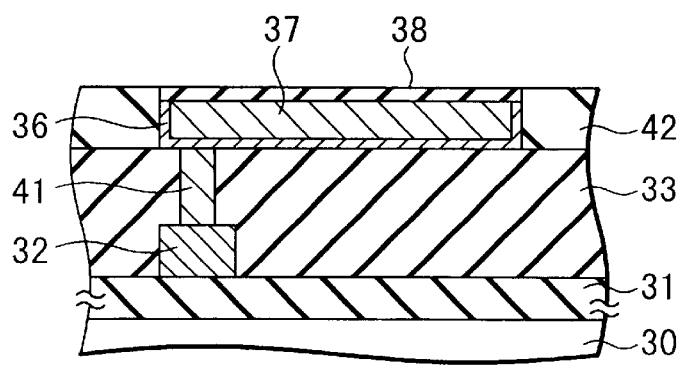
Figure 25D:
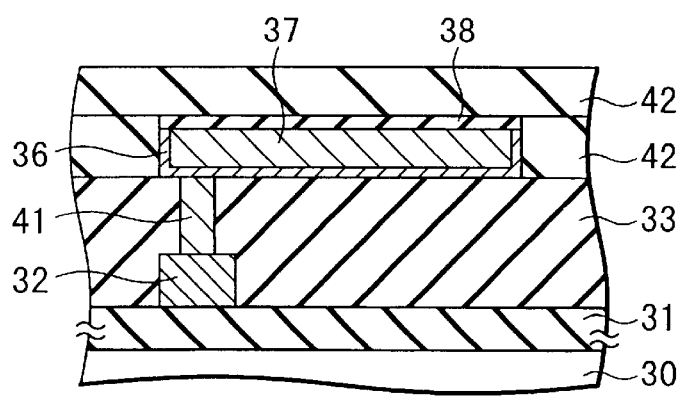

The upper Al wiring thus formed was recessed to remove an upper portion of the Al wiring in a thickness not smaller than 50 Å, as shown in FIG. 25A. Then, an intermediate layer 38 containing Al—Si—O was deposited by a sputtering method as shown in FIG. 25B. Further, CMP was applied again to permit the intermediate layer 38 to remain selectively on only the upper portion of the wiring, as shown in FIG. 25C. Still further, an organic SOG film 42 having a Young's modulus not larger than 50 GPa was deposited to form a passivation layer, as shown in FIG. 25D, thereby preparing a sample of this example.

An EM testing was applied to the resultant sample. It has been confirmed that it is possible to improve the EM reliability, as in Example II-2. It has also been confirmed that the particular effect is further enhanced, compared with the case where the organic SOG film was used on the upper portion alone of the wiring.

Example II-4

An insulating layer having a Young's modulus not larger than 50 GPa described in Example II-2 can be used as an interlayer insulating film, and all of the upper surface, side surface and bottom surface of the wiring can be covered with the particular interlayer insulating film.

A semiconductor device of the particular construction, which was prepared in this example, will now be described with reference to FIGS. 26A to 26D and 27A to 27D.

Figure 26A:
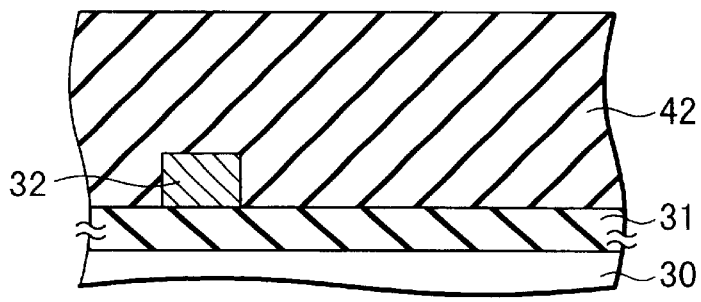
FIGS. 26A to 26D are cross sectional views collectively illustrating another example of a method of the present invention for manufacturing a semiconductor device of the present invention.
Figure 26B:
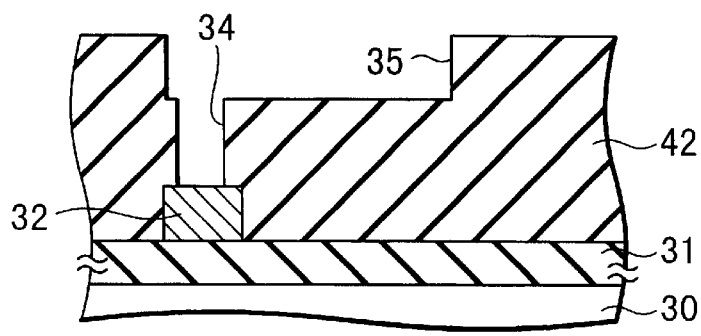
Figure 26C:
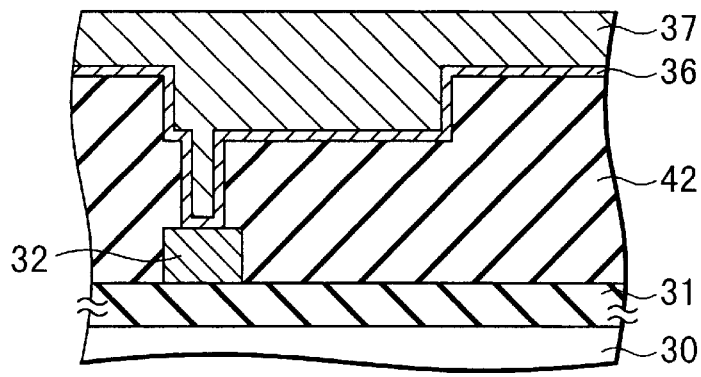
Figure 26D:
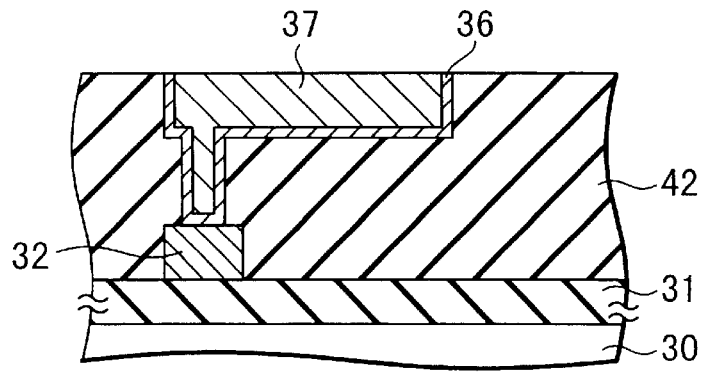

In the first step, an insulating layer 31 and a lower wiring 32 were successively formed on a substrate 30, as shown in FIG. 26A, followed by depositing an organic SOG film 42 having a Young's modulus not larger than 50 GPa on the entire surface to form an interlayer insulating film. Then, a groove 35 for forming a via hole 34 and an upper wiring was formed in the organic SOG film 42, as shown in FIG. 26B. Further, a liner 36 and an Al film 37 constituting an upper wiring were successively formed within the groove, as shown in FIG. 26C. The material of the liner 36 and the method of forming the Al film 37 were equal to those in Example II-1. Still further, the surface was flattened by CMP to form the via and the upper Al wiring, as shown in FIG. 26D.

Figure 27A:
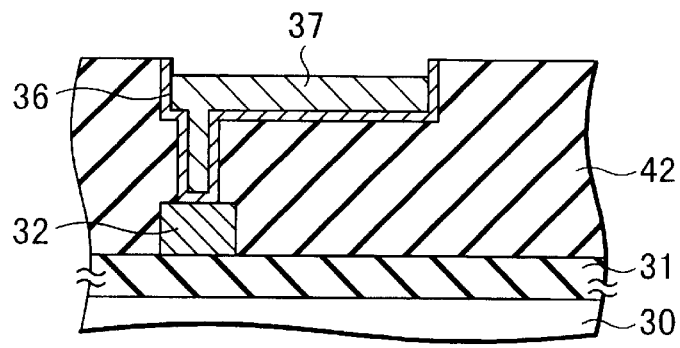
FIGS. 27A to 27D are cross sectional views collectively illustrating another example of a method of the present invention for manufacturing a semiconductor device of the present invention.
Figure 27B:
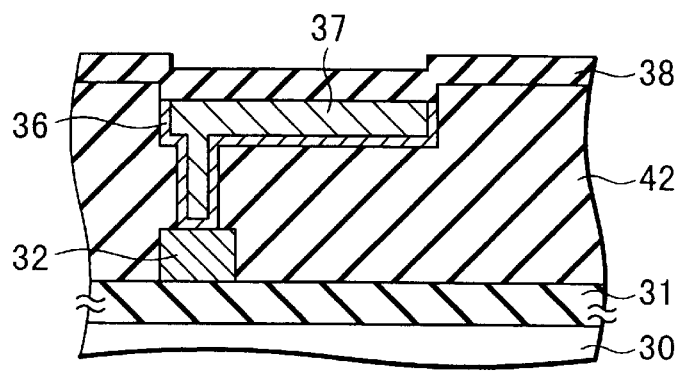
Figure 27C:
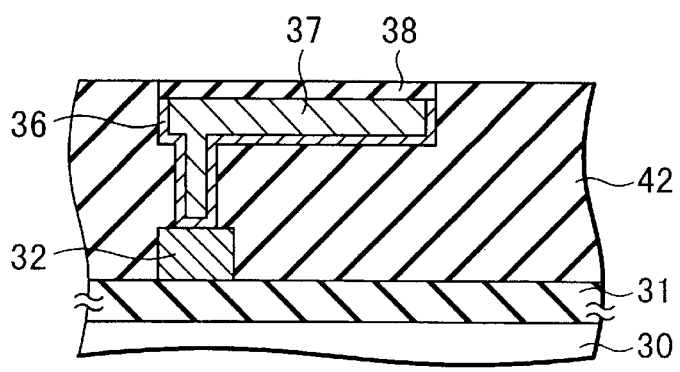
Figure 27D:
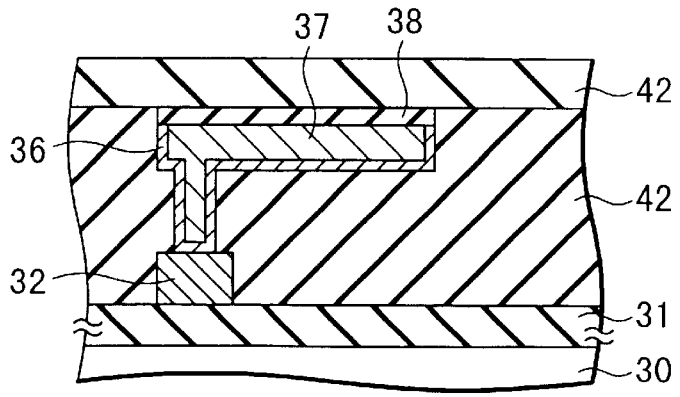

The upper Al wiring thus formed was recessed to remove an upper portion of the Al wiring in a thickness not smaller than 50 Å, as shown in FIG. 27A. Then, an intermediate layer 38 containing Al—Si—O was deposited by a sputtering method as shown in FIG. 27B. Further, CMP was applied again to permit the intermediate layer 38 to remain selectively on only the upper portion of the wiring, as shown in FIG. 27C. Still further, an organic SOG film 42 having a Young's modulus not larger than 50 GPa was deposited to form a passivation layer, as shown in FIG. 27D, thereby preparing a sample of this example.

An EM testing was applied to the resultant sample. It has been confirmed that it is possible to improve the EM reliability, as in Example II-2. It has also been confirmed that the particular effect is further enhanced, compared with the case where the organic SOG film was formed to cover the upper surface and side surface of the wiring.

Example II-5

A semiconductor device of this example will now be described with reference to FIGS. 28A to 28D and 29A to 29D.

Figure 28A:
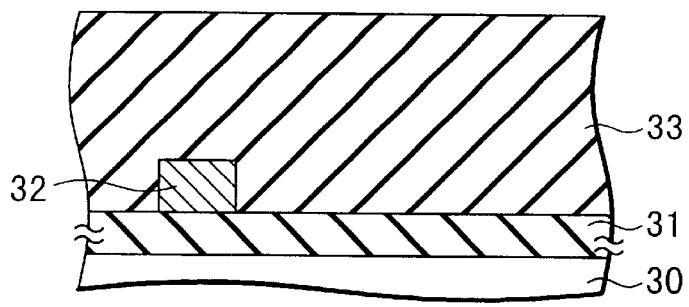
FIGS. 28A to 28D are cross sectional views collectively illustrating another example of a method of the present invention for manufacturing a semiconductor device of the present invention.
Figure 28B:
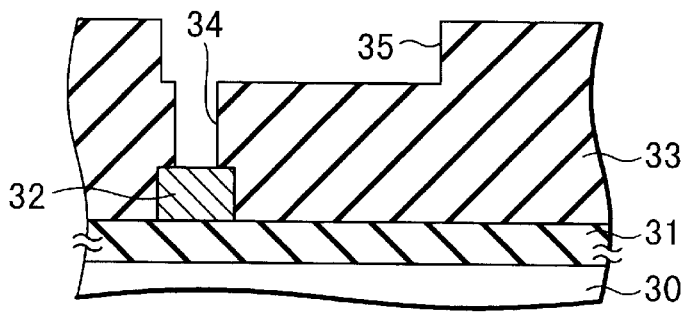
Figure 28C:
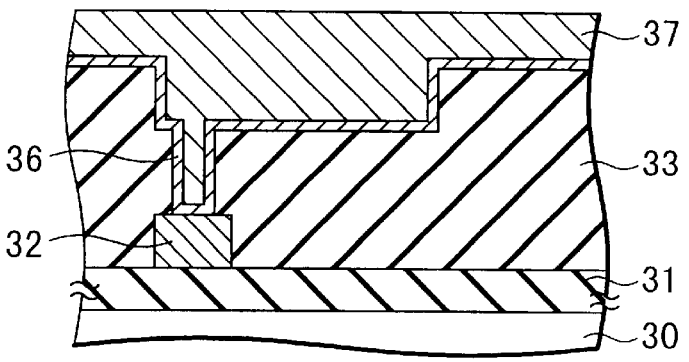
Figure 28D:
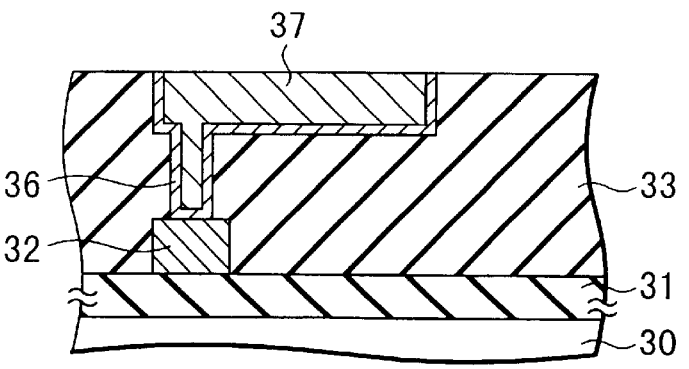

In the first step, an insulating layer 31 and a lower wiring 32 were successively formed on a substrate 30, as shown in FIG. 28A, followed by depositing a TEOS film 33 as an interlayer insulating film. Then, a groove 35 for forming a via hole 34 and an upper wiring was formed in the TEOS film 33, as shown in FIG. 28B. Further, a liner 36 and an Al film 37 constituting an upper wiring were successively deposited within the via hole 34 and the groove 35, as shown in FIG. 28C. The material of the liner 36 and the method of forming the Al film 37 were equal to those in Example II-1. Still further, the surface was flattened by CMP to form the via and the upper Al wiring, as shown in FIG. 28D.

Figure 29A:
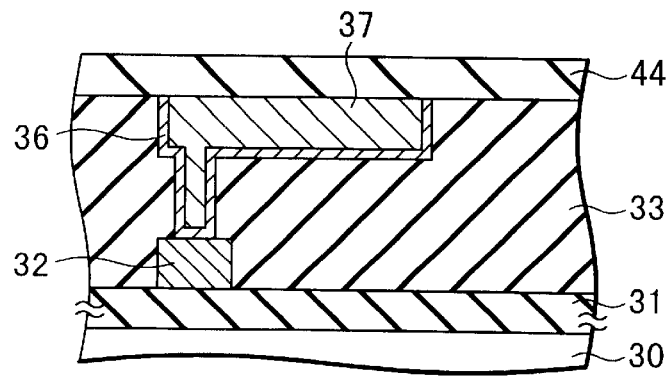
FIGS. 29A to 29D are cross sectional views collectively illustrating another example of a method of the present invention for manufacturing a semiconductor device of the present invention.
Figure 29B:
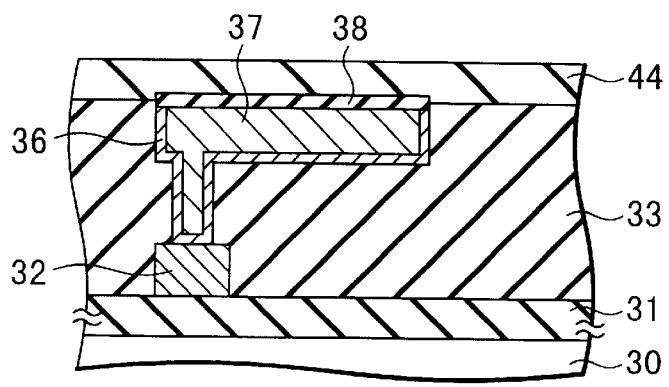

Then, a Si-containing layer 44 was formed on the upper wiring, as shown in FIG. 29A. The Si-containing layer 44, which contains Si and O, may further contain C. When a heat treatment is applied in the subsequent step, reaction is carried out between the Si-containing layer and Al constituting the upper wiring. As a result, an intermediate layer 38 containing Al—Si—O is formed at the interface between the Si-containing layer and the upper wiring, as shown in FIG. 29B. Where carbon is contained in the Si-containing layer 44, carbon is also contained in the intermediate layer 38 formed by the reaction noted above. The heat treatment in this step is carried out at, for example, 400° C. to 450° C. for about 15 minutes to 60 minutes.

Figure 29C:
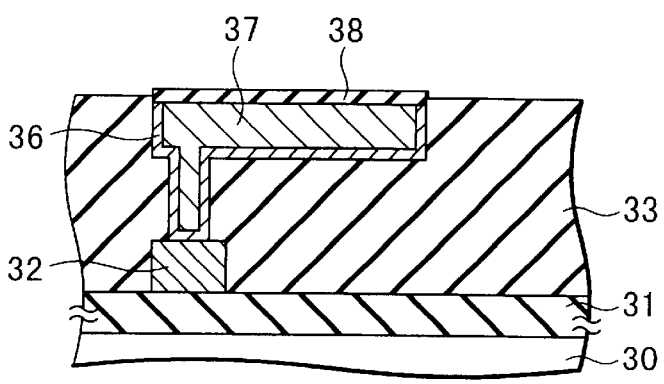
Figure 29D:
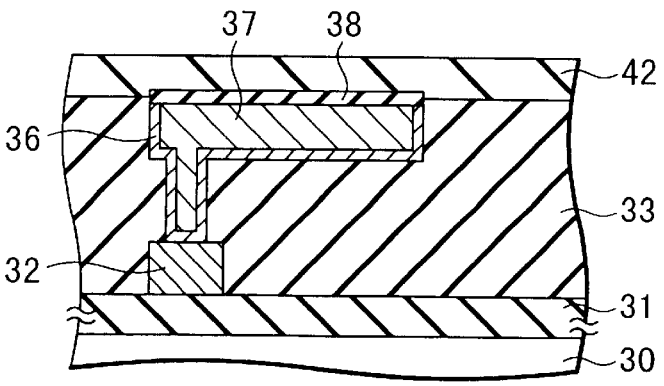

In the next step, the Si-containing layer 44 is removed except the intermediate layer formed on the upper portion of the wiring so as to expose the intermediate layer 38, as shown in FIG. 29C. For removing the Si-containing layer 44, it is possible to employ, for example, RIE, CMP, wet etching or $O_2$ asher method.

The thickness of the intermediate layer 38 present on the wiring was found to be 200 Å.

Finally, an organic SOG film 42 having a Young's modulus not larger than 50 GPa was deposited to form a passivation layer, thereby preparing a sample of this example.

An EM testing was applied to the resultant sample. It has been confirmed that it is possible to improve the EM reliability, as in Example II-2.

The intermediate layer in the semiconductor device of this example can be formed as follows. Specifically, after formation of the via and the upper Al wiring by CMP as shown in FIG. 29C, an organic SOG film formed directly thereon. Then, a heat treatment is applied so as to form the intermediate layer 38 containing Al—Si—O in a thickness of about 500 Å at the interface between the upper wiring and the organic SOG film. The heat treatment is performed at, for example, 400° C. to 450° C. for about 15 to 60 minutes.

The semiconductor device in this example can be modified in various fashions. For example, it is possible to use an Al-based alloy for forming the wiring. In this case, Al—Si—O and alloying constituents are contained in the intermediate layer. Alternatively, Al—Si—O-C and alloying constituents are contained in the intermediate layer. Further, the materials that can be used in the present invention for forming the passivation layer include, for example, a silicon oxide-based film containing an organic group formed by employing a CVD method, a deposition polymerization, a sputtering method or a spin-coating method employed in this example, an organic film a typical example of which is a polyimide film, and a silicon oxide film containing an inorganic additive. In each of these cases, it is possible to obtain effects similar to those described above.

Example II-6

A semiconductor device of this example, in which a RIE wiring is used, will now be described with reference to FIGS. 30A to 30D and 31A to 31D.

Figure 30A:
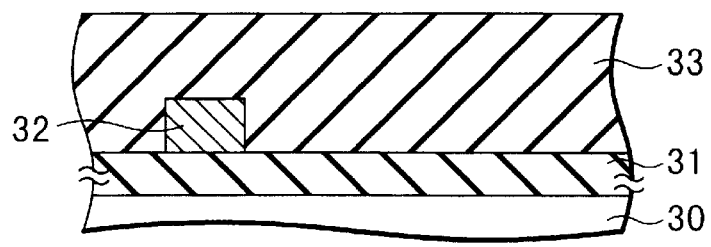
FIGS. 30A to 30D are cross sectional views collectively illustrating another example of a method of the present invention for manufacturing a semiconductor device of the present invention.
Figure 30B:
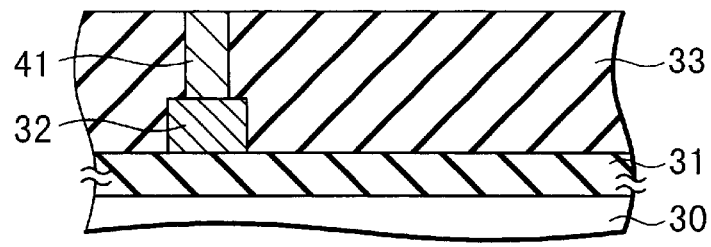

In the first step, an insulating layer 31 and a lower wiring 32 were successively formed on a substrate 30, as shown in FIG. 30A, followed by depositing a TEOS film 33 as an interlayer insulating film. It is possible to use an organic SOG film or a laminate structure of a TEOS film and an organic SOG film as the interlayer insulating film. Then, a via hole was formed in the interlayer insulating film, followed by forming a via 41 as shown in FIG. 30B. The via 41 can be formed by, for example, a selective W-CVD method, a blanket W-CVD method or an Al single damascene method.

Figure 30C:
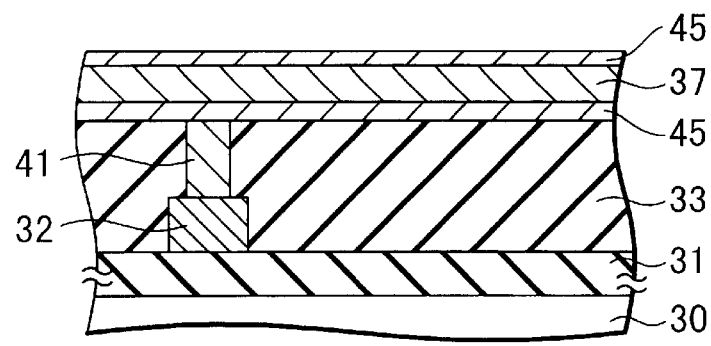
Figure 30D:
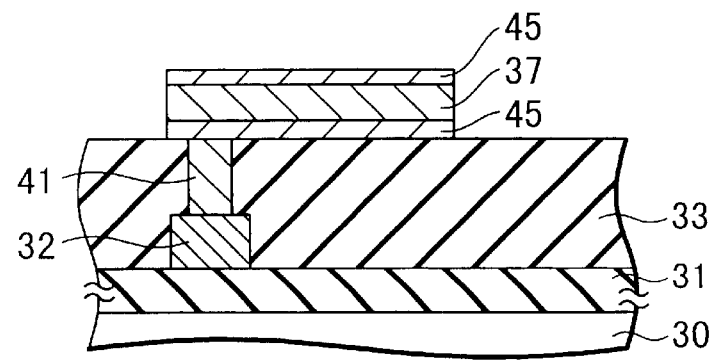

In the next step, an underlayer 45 and an Al layer 37 were formed successively as shown in FIG. 30C, followed by forming an upper wiring by RIE as shown in FIG. 30D. The underlayer 45 can be formed of, for example, Ti, TiN, Nb, Ta, TaAl, Ti/TiN, NbN, Nb/NbN/Nb, TaN or Ta/TaN/Ta. It is also possible to form a metallic layer similar to the underlayer 45 on the Al wiring 37.

Figure 31A:
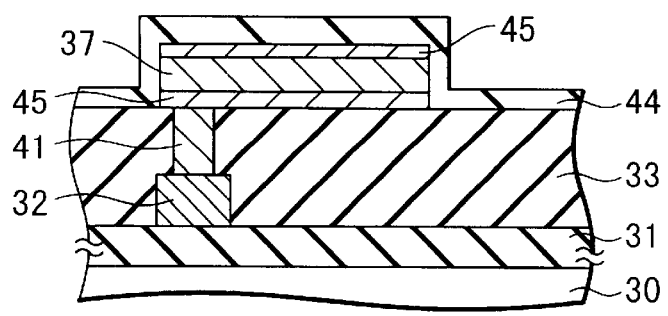
FIGS. 31A to 31D are cross sectional views collectively illustrating another example of a method of the present invention for manufacturing a semiconductor device of the present invention.
Figure 31B:
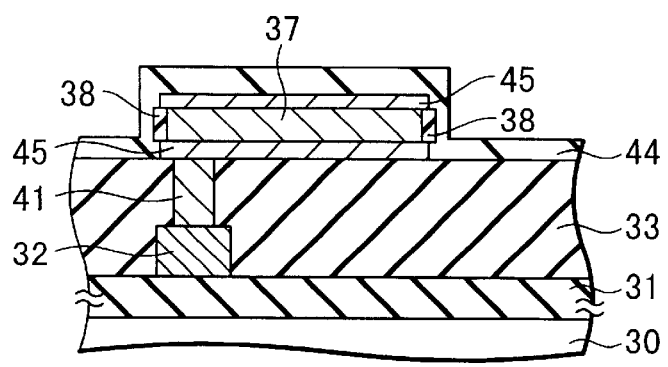

Then, a Si-containing layer 44 was formed on the upper wiring, as shown in FIG. 31A. The Si-containing layer 44, which contains Si and O, may further contain C. When a heat treatment is applied in the subsequent step, reaction is carried out between the Si-containing layer 44 and Al constituting the upper wiring 37. As a result, an intermediate layer 38 containing Al—Si—O is formed at the interface between the Si-containing layer 44 and the upper wiring 37, as shown in FIG. 31B. Where carbon is contained in the Si-containing layer 44, carbon is also contained in the intermediate layer 38 formed by the reaction noted above. The conditions for the heat treatment in this step are equal to those in Example II-5.

In the example shown in the drawing, the Si-containing layer is in contact with the side surface of the upper wiring and, thus, the intermediate layer 38 is formed on the side surface of the wiring. Where the Si-containing layer is in contact with the upper surface of the wiring, the similar intermediate layer 38 is also formed on at the interface between the upper portion of the wiring and the Si-containing layer.

Figure 31C:
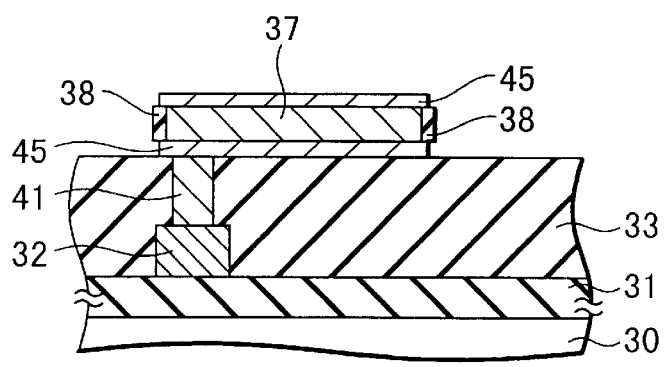

In the next step, the Si-containing layer 44 is removed so as to expose the intermediate layer 38, as shown in FIG. 31C. For removing the Si-containing layer 44, it is possible to employ, for example, RIE, wet etching or $O_2$ asher method.

Figure 31D:
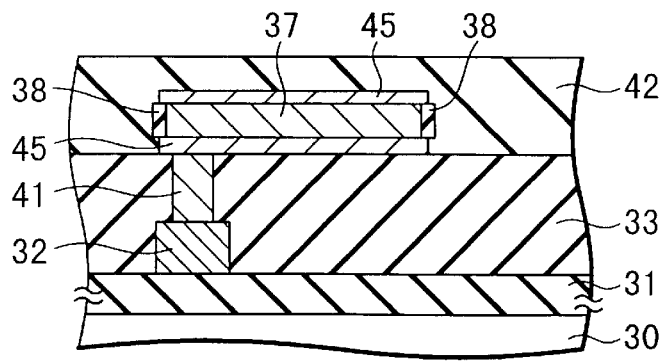

Finally, an organic SOG film 42 having a Young's modulus not larger than 50 GPa was deposited on the entire surface to form a passivation layer, as shown in FIG. 31D, thereby preparing a sample of this example.

An EM testing was applied to the resultant sample. It has been confirmed that it is possible to improve the EM reliability, as in Example II-2.

The intermediate layer in the semiconductor device of this example can be formed as follows. Specifically, after formation of the upper wiring by RIE as shown in FIG. 30D, an organic SOG film is formed directly on the upper wiring. Then, a heat treatment is performed at, for example, 400° C. to 450° C. for about 15 to 60 minutes so as to form the intermediate layer 38 containing Al—Si—O at the interface between the upper Al wiring and the organic SOG film.

Example II-7

A semiconductor device using Cu as the wiring material was prepared in this example.

In the first step, an upper wiring is formed as shown in FIG. 22D as in Example II-1, except that Cu is used as the material of the upper wiring. Then, the upper wiring thus formed is recessed to remove the upper portion of the upper wiring in a thickness not smaller than 50 Å, as shown in FIG. 23A. Further, an intermediate layer containing Cu—Si—O is formed on the remaining upper wiring 37 by a sputtering method, as shown in FIG. 23B. Still further, a CMP is applied again so as to permit the intermediate layer to remain selectively on the upper wiring as shown in FIG. 23C. Finally, an organic SOG film is formed as a passivation layer so as to prepare a semiconductor device of this example.

Alternatively, a via and an upper Cu wiring are formed as shown in FIG. 28D as in Example II-5, except that Cu is used as the wiring material. Then, a Si-containing layer containing at least Si and O is formed on the upper Cu wiring thus formed, followed by applying a heat treatment for performing a reaction so as to form an intermediate layer containing Cu—Si—O on the upper Cu wiring. It is possible for the Si-containing layer to further contain carbon. In this case, carbon is also contained in the intermediate layer formed by the reaction noted above. Then, the Si-containing layer is removed by RIE, CMP, a wet etching or an $O_2$ asher method. Finally, an organic SOG film is formed as a passivation layer so as to obtain a semiconductor device of this example.

An EM testing was applied to the semiconductor device thus prepared. It has been confirmed that it is possible to improve the EM reliability as in Example II-2. Further, the intermediate layer present on the upper portion of the wiring produces an effect as a barrier layer of Cu.

The intermediate layer included in the semiconductor device described above can be formed as follows. Specifically, after formation of the upper Cu wiring, an organic SOG film is formed directly on the upper Cu wiring. Then, an intermediate layer containing Cu—Si—O is formed at the interface between the upper Cu wiring and the organic SOG film by a heat treatment.

The semiconductor device in this example can be modified in various fashions. For example, the intermediate layer may further contain C. It is possible to use a Cu-based alloy for forming the wiring. In this case, Cu—Si—O and alloying constituents are contained in the intermediate layer. Alternatively, Cu—Si—O—C and alloying constituents are contained in the intermediate layer. Further, the materials that can be used in the present invention for forming the passivation layer include, for example, a silicon oxide-based film containing an organic group formed by employing a CVD method, a deposition polymerization, a sputtering method or a spin-coating method employed in this example, an organic film a typical example of which is a polyimide film, and a silicon oxide film containing an inorganic additive. In each of these cases, it is possible to obtain effects similar to those described above.

The semiconductor device for Example II is particularly effective for the wiring of a multi-layer structure. However, the method of Example II can also be applied to the wiring of a single layer structure.

Comparative Example II-1

The conventional methods for forming a via and a wiring include, for example, a W via method, a RIE (reactive ion etching) method, a single damascene method, a dual damascene method and a pillar method. This Comparative Example will now be described with reference to FIGS. 32A to 32D on the basis of the dual damascene method.

Figure 32A:
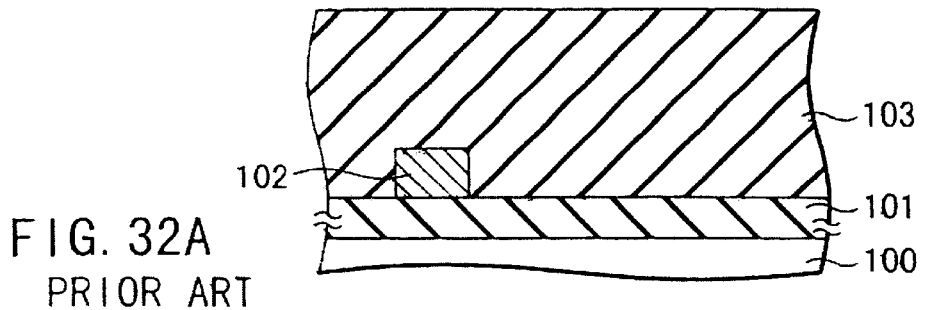
FIGS. 32A to 32D are cross sectional views collectively illustrating a conventional method for manufacturing a semiconductor device.

In the first step, an insulating layer 101 and a W-wiring 102 were successively formed on a semiconductor substrate 100, as shown in FIG. 32A, followed by forming a TEOS film 103 on the entire surface as an interlayer insulating film.

Figure 32B:
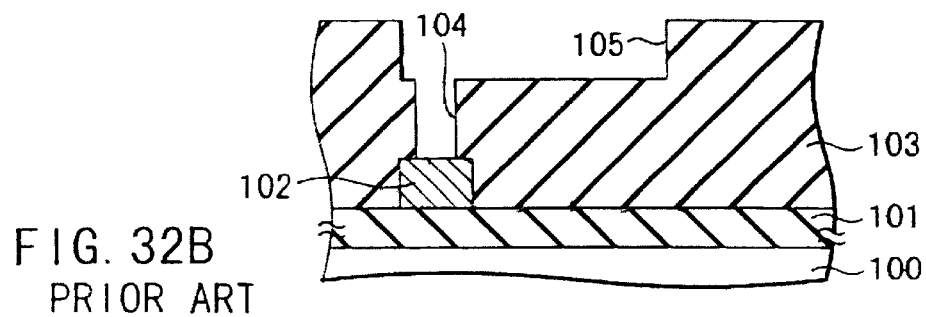

Then, a via hole 104 and a groove 105 for forming an upper wiring were formed in the TEOS film 103, as shown in FIG. 32B.

Figure 32C:
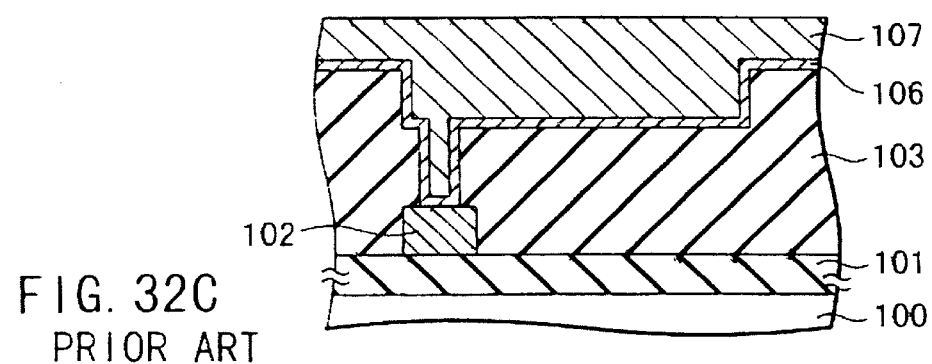
Figure 32D:
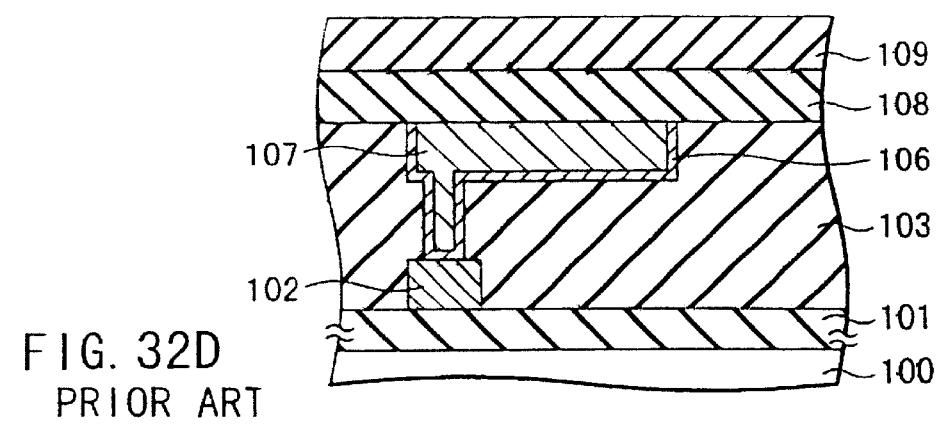

After formation of a liner 106, an Al film 107 was formed by a reflow sputtering method within a via hole and a groove for forming an upper wiring so as to obtain a structure as shown in FIG. 32C. Then, a via and an upper wiring were formed by CMP. Finally, a TEOS film 108 and a SiN film 109 were successively deposited to form a passivation layer, thereby obtaining a semiconductor device constructed as shown in FIG. 32D.

An EM testing was applied to the semiconductor device thus prepared, with the results as shown in Table 2. In the wiring structure of this Comparative Example, the side surface and the bottom surface of the damascene wiring are in contact with the liner and, thus, the interfacial energy is suppressed to a low level, as shown in Table 2. However, since the upper portion of the wiring is in direct contact with the TEOS film, the interfacial energy in the contact region is high. As a result, EM proceeds because of the interfacial diffusion in the upper portion of the wiring. It follows that the activation energy of EM is low, i.e., 0.2 to 0.7 eV.

As apparent from this Comparative Example, it is impossible to improve the EM reliability in the case of employing the conventional multi-layer wiring structure.

As described above in detail, the present invention provides a semiconductor device having a high EM reliability and a method of manufacturing the same. The technical idea of the present invention can be effectively utilized for improving the reliability of a semiconductor device, particularly, an LSI having a multi-layer wiring structure. Naturally, the present invention has a high industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate having a surface;
   an insulating layer formed on the surface of said semiconductor substrate and having a groove portion for wiring;
   a wiring formed in said groove portion for wiring of said insulating layer, said wiring comprising grain boundaries in a cross section parallel to a longitudinal direction, and
   a via formed in said insulating layer and connected to said wiring,
      wherein said grain boundaries comprise at least one inclined grain boundary inclined with respect to the surface of said semiconductor substrate at an angle of inclination of not more than 60°.

2. The semiconductor device according to claim 1, further comprising a conductive layer formed in contact with at least three surfaces, said at least three surfaces comprising a bottom surface of said wiring, a first side surface of said wiring, and a second side surface of said wiring, said conductive layer comprising an element differing from the most prevalent element or elements constituting said wiring.

3. The semiconductor device according to claim 1, wherein said wiring is an upper layer wiring, and said upper layer wiring is electrically connected to a lower layer wiring through the via.

4. The semiconductor device according to claim 1, wherein said at least one inclined grain boundary inclined with respect to the surface of said semiconductor substrate at an angle of inclination of not more than 60° is formed in an amount of at least 20% of the total of said grain boundaries present in said wiring.

5. The semiconductor device according to claim 2, wherein at least one inclined grain boundary inclined with respect to the surface of said semiconductor substrate at an angle of inclination of not more than 60° is present above said via or in a region not longer than 3 μm away from the via.

6. The semiconductor device according to claim 1, wherein said wiring is formed by a damascene process.

7. The semiconductor device according to claim 1, wherein said wiring comprises a first wiring portion formed by an LTS method and a second wiring portion formed by a reflow sputtering method on said first wiring portion, a thickness of said first wiring portion differing from a thickness of said second wiring portion.

8. The semiconductor device according to claim 1, wherein said wiring comprises a wiring material, and a metal material layer arranged in said wiring, said metal material layer being formed of a metal differing from said wiring material.

9. The semiconductor device according to claim 8, wherein said wiring material comprises a first material selected from the group consisting of W, Al, alloys of Al, Cu, and alloys of Cu, and said metal material layer is formed of a second material selected from the group consisting of Ti, TiN, Ta, TaN, TaAl, Nb, NbN, Ti/TiN, Nb/NbN/Nb, and Ta/TaN/Ta.

10. The semiconductor device according to claim 2, wherein said via comprises tungsten or aluminum.

11. The semiconductor device according to claim 2 wherein said conductive layer is a metal layer.

12. The semiconductor device according to claim 2, wherein said conductive layer is a compound layer.

13. The semiconductor device according to claim 6, wherein said damascene process is a dual damascene process.

14. The semiconductor device according to claim 6, wherein said damascene process is a single damascene process.

* * * * *